US008106375B2

(12) United States Patent
Chen et al.

(10) Patent No.: US 8,106,375 B2
(45) Date of Patent: Jan. 31, 2012

(54) RESISTANCE-SWITCHING MEMORY BASED ON SEMICONDUCTOR COMPOSITION OF PEROVSKITE CONDUCTOR DOPED PEROVSKITE INSULATOR

(75) Inventors: I-Wei Chen, Swarthmore, PA (US); Yudi Wang, Drexel Hill, PA (US); Soo Gil Kim, Drexel Hill, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 980 days.

(21) Appl. No.: 11/291,945

(22) Filed: Nov. 30, 2005

(65) Prior Publication Data

US 2007/0120124 A1    May 31, 2007

(51) Int. Cl.
*H01L 45/00* (2006.01)
*H01L 27/24* (2006.01)
(52) U.S. Cl. ............... 257/4; 257/613; 257/E45.003; 257/E27.004
(58) Field of Classification Search ............ 257/43, 257/1, 2, 3, 4, 5, 613, 614, 615, E45.001, 257/E45.002, E45.003, E27.004, E29.17
See application file for complete search history.

(56) References Cited

U.S. PATENT DOCUMENTS

| | | | | |
|---|---|---|---|---|
| 3,886,577 | A | 5/1975 | Buckley | 357/2 |
| 5,986,301 | A | 11/1999 | Fukushima et al. | 257/306 |
| 6,473,332 | B1 | 10/2002 | Ignatiev et al. | 365/148 |
| 6,717,199 | B2 | 4/2004 | Laibowitz et al. | 257/295 |
| 6,762,481 | B2 | 7/2004 | Liu et al. | 257/595 |
| 7,071,008 | B2 | 7/2006 | Rinerson et al. | 438/3 |
| 2005/0151156 | A1 | 7/2005 | Wu et al. | 257/107 |

OTHER PUBLICATIONS

Beck, A., et al., "Reproducible switching effect in thin oxide films for memory applications," *Applied Physics Letts.*, 2000, 77(1), 139-141.
*CRC Handbook of Chemistry and Physics.*, 83$^{rd}$ Ed., Lide, D.R. (Ed.), CRC Press, 2002, 12-130.
Liu, S.Q., et al., "Electric-pulse-induced reversible resistance change effect in magnetoresistive films," *Applied Physics Letts.*, 2000, 76(19), 2749-2751.
Schmehl, A., et al., "Transport properties of LaTiO$_{3+x}$ films and heterostructures," *Applied Physics Letts.*, 2003, 82(18), 3077-3079.
Simmons, J.G., et al., "New condition and reversible memory phenomena in thin insulating films," *Proc. Roy. Soc. A, London*, 1967, 301, 77-102.
Beck, A., et al., "Reproducible switching effect in thin oxide films for memory applications," *Applied Physics Letts.*, 2000, 77(1), 139-141.
*CRC Handbook of Chemistry and Physics*, 83$^{rd}$ Ed., Lide, D.R. (Ed.), CRC Press, 2002, 12-130.

(Continued)

*Primary Examiner* — Samuel Gebremariam
*Assistant Examiner* — Andrew O. Arena
(74) *Attorney, Agent, or Firm* — Woodcock Washburn, LLP

(57) ABSTRACT

Resistance-switching oxide films, and devices therewith, are disclosed. Resistance-switching oxide films, according to certain preferred aspects of the present invention, include at least about 75 atomic percent of an insulator oxide matrix having a conducting material dopant in an amount up to about 25 atomic percent. The matrix and dopant are preferably in solid solution. The insulator oxide matrix may also preferably include about 6 to about 12 atomic percent of a conducting material dopant. According to certain aspects of the present invention, the insulator oxide matrix, the conducting material dopant, or both, may have a perovskite crystal structure. The insulator oxide matrix may preferably include at least one of LaAlO$_3$ and CaZrO$_3$. Preferred conducting material dopants include SrRuO$_3$, CaRuO$_3$, or combinations thereof.

117 Claims, 19 Drawing Sheets

OTHER PUBLICATIONS

Liu, S.Q., et al., "Electric-pulse-induced reversible resistance change effect in magnetoresistive films," *Applied Physics Letts.*, 2000, 76(19), 2749-2751.

Schmehl, A., et al., "Transport properties of $LaTiO_{3+x}$ films and heterostructures," *Applied Physics Letts.*, 2003, 82(18), 3077-3079.

Simmons, J.G., et al., "New condition and reversible memory phenomena in thin insulating films," *Proc. Roy. Soc. A, London*, 1967, 301, 77-102.

Watanabe, Y., et al., "Current-driven insulator-conductor transition and nonvolatile memory in chromium-doped $SrTiO_3$ single crystals," *Applied Physics Letts.*, 2001, 78(23), 3738-3740.

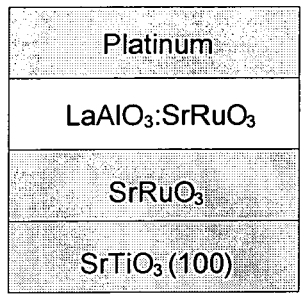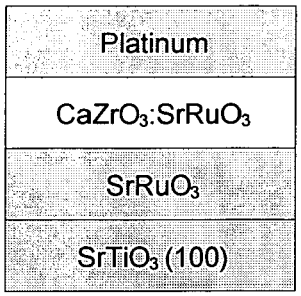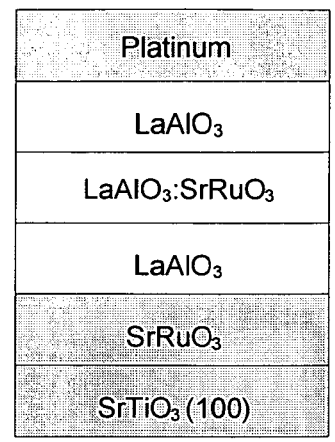
FIG. 1(a)  FIG. 1(b)  FIG. 1(c)
FIGURE 1

RESISTANCE-SWITCHING MEMORY BASED ON SEMICONDUCTOR COMPOSITION OF PEROVSKITE CONDUCTOR DOPED PEROVSKITE INSULATOR

FIELD OF THE INVENTION

The invention generally relates to semiconductor devices, and more particularly to resistance-switching oxide semiconductor devices. The present invention also generally relates to resistance-switching oxide compositions and methods for making same.

BACKGROUND OF THE INVENTION

Materials exhibiting reversible resistance switching are attractive for many of today's semiconductor devices, including non-volatile random-access memory devices. However, previous efforts in the art to reversibly vary electrical performance have exhibited numerous drawbacks. For example, some capacitance-switching semiconductor devices, such as doped Schottky-junction diodes, require relatively large amounts of electrical power (voltage) to switch to, and maintain, a particular capacitance state. Still further, such a device completely loses its capacitance state when the power is withdrawn. Current leakage, and associated heat-build up, are also especially problematic with these switchable semiconductor devices. Thus, high power consumption, current leakage and poor retention characteristics make these devices unsuitable for many practical applications.

Other efforts in the art have taught that several different resistance-switching technologies can be triggered by voltage. This phenomenon has sometimes been called an EPIR (Electrical Pulse Induced Resistance) switching effect. EPIR semiconductor devices are disclosed in U.S. Pat. No. 3,886,577 (Buckley). In the Buckley devices, a sufficiently high voltage (50 V) is applied to a semiconductor thin film in which an approximately 10 micron portion, or filament, of the film may be set to a low resistivity state. Filament size is highly dependant on the amount of current flowing through the device. The device may then be reset to a high resistance state by the action of a second high current pulse (150 mA). However, the set voltage is strongly affected by the number of switching cycles performed. Thus, these devices generally exhibit high power consumption and poor cycle fatigue performance.

Recent efforts in the art have investigated ferroelectric and magnetoresistive materials for non-volatile memory applications. These materials, however, suffer from cycle fatigue and retention problems. Moreover, many magnetoresistive oxide devices require magnetic switching fields and have low operating temperatures.

Some thin film materials in the perovskite family, especially in colossal magnetoresistive (CMR) thin films, have exhibited reversible resistance changes upon application of an electrical stimuli in a magnetic field. It has been recently found that some transition metal oxides in the perovskite family exhibit resistance-switching under a voltage trigger in the absence of a magnetic field. Indeed, the recent observation of the electrical pulse induced resistance (EPIR) change effect in perovskite oxide thin films at room temperature and in the absence of a magnetic field has drawn much attention. See, e.g., "Electric-Pulse Induced Reversible Resistance Change Effect in Magnetoresistive Films," S. Q. Liu, N. J. Wu, A. Ignatiev, Applied Physics Letters, Vol. 76, No. 23 (2000). In these previous efforts, a $Pr_{1-x}Ca_xMnO_3$ (PCMO) oxide film placed between two electrodes served as an EPIR device. The resistance states of such simple structured semiconductor devices were switchable by the application of a voltage trigger. The trigger could directly increase or decrease the resistance of the thin film sample depending on voltage polarity. Such voltage triggering phenomenon can be useful in a variety of device applications, including non-volatile memory devices such as resistance random access memory (RRAM) devices.

These early devices, however, required relatively high voltage triggers and the EPIR effect was found to be cycle dependant. The EPIR effect, measured as the ratio between the resistance states, was found to decrease as the number of triggering events increased. Thus, the high power requirements and lack of resistance state stability plagued these early EPIR compositions and devices. Although, the basic mechanism responsible for the EPIR effect is still under investigation, there exist a need in the art to develop improved resistance-switching semiconductor devices for potential application in different technology areas.

Thus, there is a need in the art for resistance-switching semiconductor devices having low power consumption. Still further, there is a need in the art for such semiconductor devices having low voltage leakage and high retention of the respective low and high resistance states. There is also a need in the art for resistance-switching semiconductor devices having improved cycle fatigue performance.

SUMMARY OF THE INVENTION

Resistance-switching oxide films, according to the certain preferred aspects of the present invention, include at least about 75 atomic percent of an insulator oxide matrix having a conducting material dopant in an amount up to about 25 atomic percent. The matrix and dopant are preferably in solid solution. The insulator oxide matrix may thus preferably include about 5 to about 17 atomic percent of a conducting material dopant. Most preferably, the insulator oxide matrix may include about 6 to about 12 atomic percent of a conducting material dopant. The insulator oxide matrix may include MgO, while the dopant may include Ti, V, Cr, Mn, Fe, Co, Ni, Cu, TiO, VO, MnO, FeO, CoO, NiO, CuO, or combinations thereof.

More preferably, at least one of the insulator oxide matrix and the conducting material matrix may have a perovskite crystal structure. As used herein, perovskite crystal structures may also include perovskite-like crystal structures. In this regard, the preferred insulator oxide matrix may include $LaAlO_3$, $CaZrO_3$, $SrZrO_3$, $BaZrO_3$, $CaHfO_3$, $SrHfO_3$, $BaHfO_3$, $LaScO_3$, $GdScO_3$, $DyScO_3$, or combinations thereof. Preferred conducting material dopants include $SrRuO_3$, $CaRuO_3$, $BaRuO_3$, $SrMoO_3$, $CaMoO_3$, $BaMoO_3$, $SrIrO_3$, $CaIrO_3$, $BaIrO_3$, $SrVO_3$, $CaVO_3$, $SrNbO_3$, $CaNbO_3$, $SrCrO_3$, $SrFeO_3$, $CaFeO_3$, $LaTiO_3$, $LaNiO_3$, $LaCuO_3$, $LaRhO_3$, $(La,Sr)TiO_3$, $(La,Sr)FeO_3$, $(La,Sr)MnO_3$, or combinations thereof.

Certain presently preferred embodiments of the present invention include semiconductor devices having at least one resistance-switching oxide film as described herein. In accordance with an embodiment of the present invention, the device may include a substrate, a first electrically conductive layer disposed on the substrate, at least one resistance-switching oxide film, as described herein, disposed on the first conductive layer, and a second electrically conductive layer disposed on the oxide film. According to certain preferred aspects of the present invention, the first electrically conductive layer may serve as the device substrate. The first electrically conductive layer and resistance-switching oxide layer may also be deposited to maintain epitaxial registry with a single crystal semiconductor substrate. In accordance with still other embodiments of the present invention, the semiconductor device may include at least one resistance-switching oxide film wherein the dopant has a work function equivalent to that of the first electrically conductive layer, the second electrically conductive layer, or both.

BRIEF DESCRIPTION OF THE DRAWINGS

Various aspects of the present invention will become more apparent in reference to the accompanying drawings in which:

FIG. 1 (a)-1(c) depict various embodiments of semiconductor devices according to certain preferred aspects of the present invention.

DETAILED DESCRIPTION OF ILLUSTRATIVE EMBODIMENTS

Figure 2:
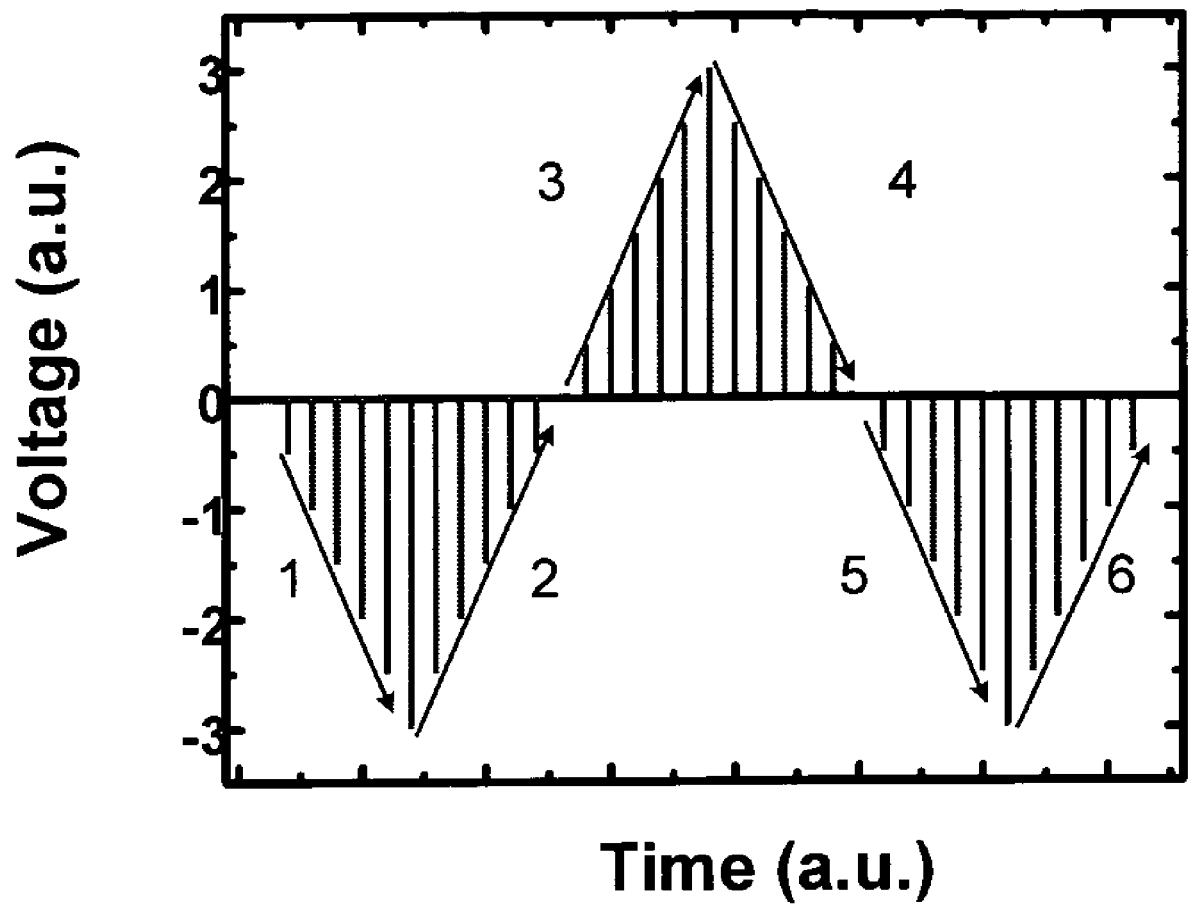
FIG. 2 illustrates the voltage cycle applied at room temperature to certain preferred embodiments of the present invention.

The present invention relates to two-point resistance-switching oxide layers, semiconductor devices incorporating same, and methods for making such oxide layers and devices. Resistance-switching oxide layers, and devices incorporating same, are suitable for various non-volatile memory applications. Under a resistance-switching regime, when an appropriate voltage pulse is applied, the resistance of the oxide layer can be increased and remain so until application of another appropriate voltage pulse, typically of the opposite polarity, which returns the resistance to the low value. Devices incorporating such resistance-switching oxide layers should be switchable at a modest voltage, preferably below about 3 V.

Resistance-switching oxide films, according to the certain preferred aspects of the present invention, include at least about 75 atomic percent of an insulator oxide matrix having a conducting material dopant in an amount up to about 25 atomic percent. The matrix (solvent) and dopant (solute) are preferably in solid solution, without appreciable precipitate formation or phase separation. The insulator oxide matrix may preferably include about 5 to about 17 atomic percent of a conducting material dopant. Most preferably, the insulator oxide matrix may include about 6 to about 12 atomic percent of a conducting material dopant. The insulator oxide matrix may include MgO. The insulator oxide may also include at least one binary oxide, including but not limited to:

(a) $X_2O_3$ where X is Al, Ga, In, Sc, Y, Gd, Tb, Dy, Ho, Er, Tm, Yb, or Lu;

(b) $X_1O_2$ where $X_1$ is Si, Ge, Zr or Hf; and (c) $X_2O_5$ where X is Nb or Ta.

Dopants may include various metals and/or their respective oxides such as Ti, V, Cr, Mn, Fe, Co, Ni, Cu, TiO, VO, MnO, FeO, CoO, NiO, CuO, or combinations thereof. Dopants may also include Pt, Pd, Au, Ag, Ir, Rh, Os, Ru, Re, W, Mo, Ta, Nb, Hf, Zr, Al, or combinations thereof. Dopants may further include $VO_2$, $CrO_2$, $NbO_2$, $MoO_2$, $RuO_2$, $RhO_2$, $WO_2$, $OsO_2$, $IrO_2$, $PtO_2$, or combinations thereof.

More preferably, at least one of the insulator oxide matrix and the conducting material matrix may have a perovskite, or perovskite-like, crystal structure. In this regard, the preferred insulator oxide matrix may include $CaZrO_3$, $SrZrO_3$, $BaZrO_3$, or combinations thereof. The insulator oxide matrix may also include at least one of:

(a) $X_1HfO_3$, where $X_1$ is Ca, Sr, or Ba;

(b) $X_1AlO_3$, where $X_1$ is La, Ce, Pr, Nd, Pm, Sm, Eu, Gd, Tb, Dy, Ho, Er, Tm, Yb, Lu, or Y;

(c) $X_1ScO_3$, where $X_1$ is La, Ce, Pr, Nd, Pm, Sm, Eu, Gd, Tb, Dy, Ho, Er, Tm, Yb, Lu, or Y; and (d) $Ba(X_1)_{1/3}(X_2)_{2/3}O_3$, where $X_1$ is Mg or Zn, and $X_2$ is Nb or Ta.

Preferred conducting oxide dopants include perovskite structures including, but not limited to, $SrRuO_3$, $CaRuO_3$, $BaRuO_3$, $SrMoO_3$, $CaMoO_3$, $BaMoO_3$, $SrIrO_3$, $CaIrO_3$, $BaIrO_3$, $SrVO_3$, $CaVO_3$, $SrNbO_3$, $CaNbO_3$, $SrCrO_3$, $SrFeO_3$, $CaFeO_3$, $LaTiO_3$, $LaNiO_3$ $LaCuO_3$, $LaRhO_3$, $(La,Sr)TiO_3$, $(La,Sr)MnO_3$, $(La,Sr)FeO_3$, or combinations thereof. Dopants may also include at least one of:

(a) $A_1X_1O_3$, where $A_1$ is Ca, Sr, or Ba; and $X_1$ is V, Cr, Mn, Fe, Co, Nb, Mo, Ru, Rh, Ta, W, Re, Os, or Ir;

(b) $A_1X_1O_3$ where $A_1$ is La, Ce, Pr, Nd, Pm, Sm, Eu, Gd, Tb, Dy, Ho, Er, Tm, Yb, Lu, or Y; and $X_1$ is Ti, V, Co, Ni, Cu, Nb, Mo, Ru, Rh, or Ir; and (c) $(A_1,A_2)X_1O_3$ where $A_1$ is La, Ce, Pr, Nd, Pm, Sm, Eu, Gd, Tb, Dy, Ho, Er, Tm, Yb, Lu, or Y; $A_2$ is Ca, Sr, or Ba; and $X_1$ is Ti, V, Cr, Mn, Fe, Co, Ni, Cu, Nb, Mo, Ru, Rh, Ta, W, Re, Os, or Ir.

Certain presently preferred embodiments of the present invention also include semiconductor devices having at least one resistance-switching oxide layer as described herein. In accordance with an embodiment of the present invention, the device may include a substrate, a first conductive layer disposed on the substrate, at least one resistance-switching oxide layer as described herein, and a second electrically conductive layer disposed on the oxide layer. The first and second electrically conductive layers may respectively serve as bottom and top electrodes. In this regard, at least one of the electrodes may also comprise Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, metal silicides, or combinations thereof. Electrodes may also comprise $CrO_2$, $MoO_2$, $RuO_2$, $RhO_2$, $WO_2$, $OsO_2$, $IrO_2$, $PtO_2$, or combinations thereof. In certain preferred embodiments, the first electrically conductive layer may also serve as the device substrate. In still other preferred embodiments, the semiconductor device may include at least one resistance-switching oxide film wherein the dopant has a work function equivalent to that of the first electrically conductive layer, the second electrically conductive layer, or both. Persons skilled in the art understand the concept of work function, and further reference may be made to CRC Handbook of Chemistry and Physics, $83^{rd}$ ed., Lide, D.R (ed.), p. 12-130, CRC Press (2002), hereby incorporated by reference. As used herein, a work function may be considered equivalent if it is within about 25% of at least one target comparative work function value.

The various layers may be deposited by any number of sputtering and/or deposition techniques including, but not limited to, direct-current (DC) sputtering, radio-frequency (RF) sputtering, pulsed laser deposition (PLD), physical vapor deposition (PVD), atomic layer deposition (ALD), chemical vapor deposition (CVD), and ion-assisted deposition (IAD). The electrically conductive layer may be preferably deposited using a shadow mask technique in conjunction with RF sputtering. In accordance with certain preferred aspects of the present invention, the first electrically conductive layer and resistance-switching oxide layer may be deposited to maintain epitaxial registry, i.e., lattice matching, with a single crystal substrate. As seen in FIG. 1(a), the device may have a $SrTiO_3$ single crystal substrate in the 100 orientation, $SrRuO_3$ as the first electrically conductive layer/bottom electrode, and platinum as the second electrically conductive layer/top electrode. The device may further include a resistance-switching oxide layer having $LaAlO_3$ as the insulator oxide matrix and $SrRuO_3$ as the conducting material dopant. Preferably, $SrRuO_3$ is present in an amount of about 6 to about 12 atomic percent. FIG. 1(b) shows an alternate embodiment of the present invention wherein the resistance-switching oxide layer comprises a $CaZrO_3$ insulator matrix doped with $SrRuO_3$.

At least one isolation layer may be included to alter the low voltage performance of the semiconductor device. FIG. 1(c) depicts yet another embodiment of the present invention having a $LaAlO_3$ isolation layer disposed between the resistance-switching layer and the respective top and bottom electrodes. Here again, $LaAlO_3$ is shown as the insulator oxide matrix and $SrRuO_3$ as the conducting dopant. In accordance with certain preferred aspects of the present invention, at least one of the isolation layers may be composed of the same insulator oxide utilized in the resistance-switching layer. Room temperature resistance-switching characteristics, depicted as I-V and R-V plots, of certain preferred embodiments of the present invention were determined utilizing a full cycle of positive and negative voltage pulse ranges as shown in FIG. 2.

Figure 3:
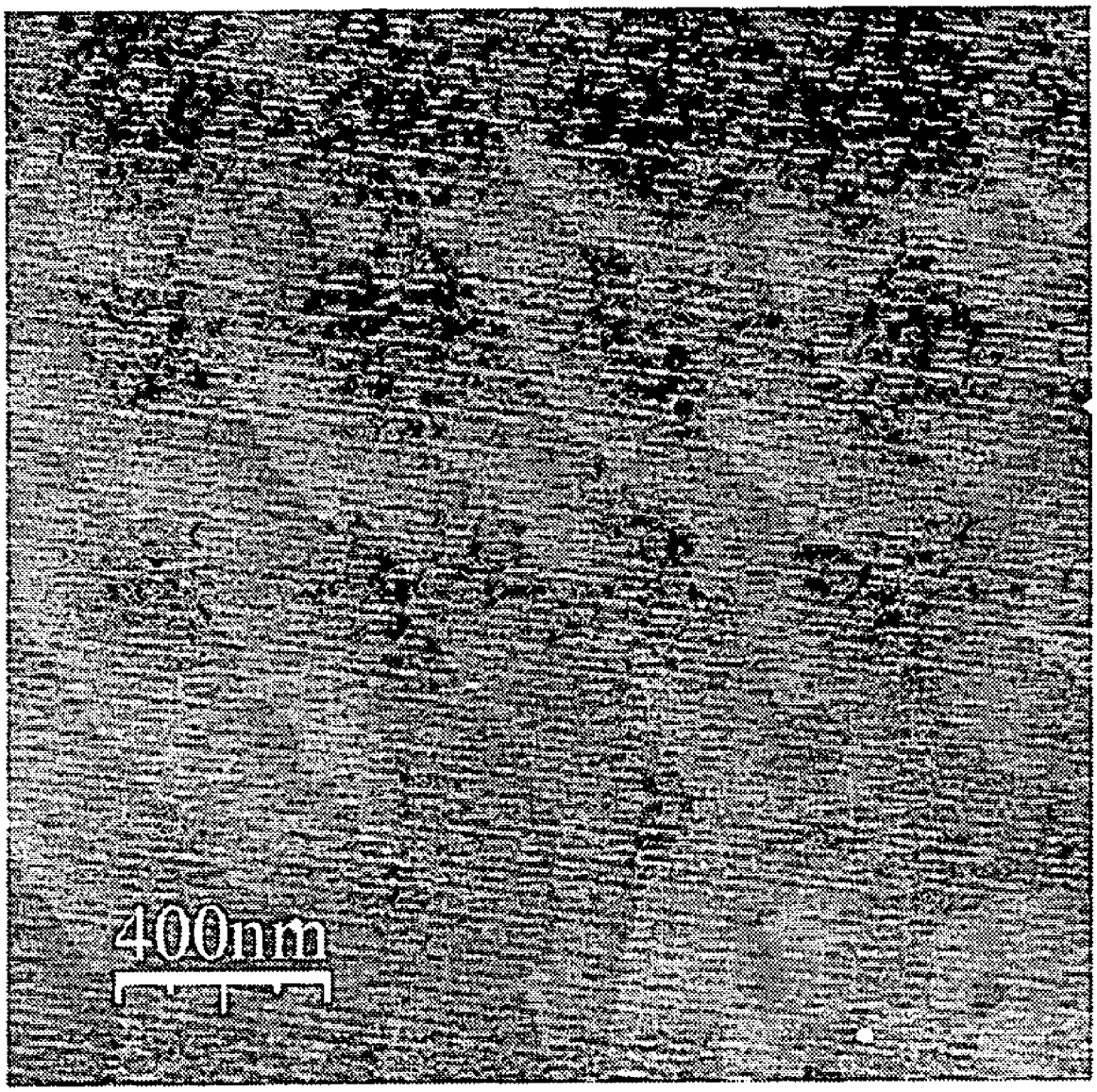
FIG. 3 shows the surface topography of a $SrRuO_3$ (SRO) first conductive layer deposited under preferred pulsed laser deposition (PLD) conditions.
Figure 4:
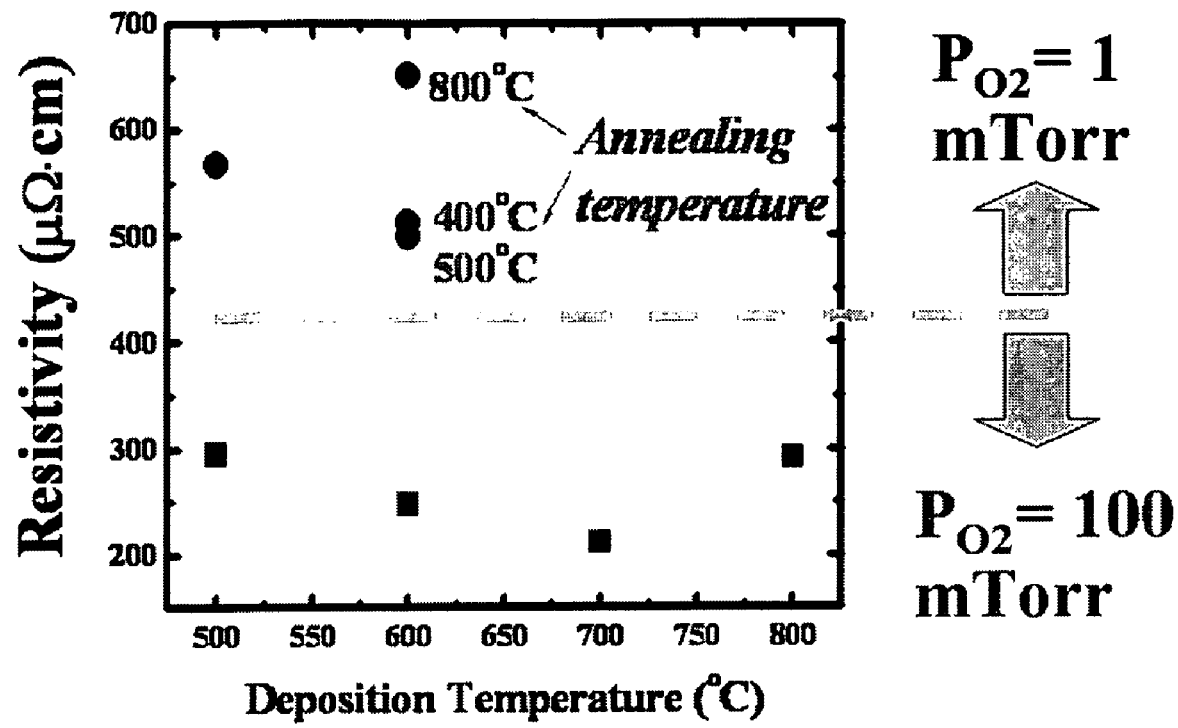
FIG. 4 illustrates the low resistivity of a $SrRuO_3$ (SRO) first conductive layer on a $SiTiO_3$ (STO) substrate layer deposited under preferred PLD conditions.
Figure 5:
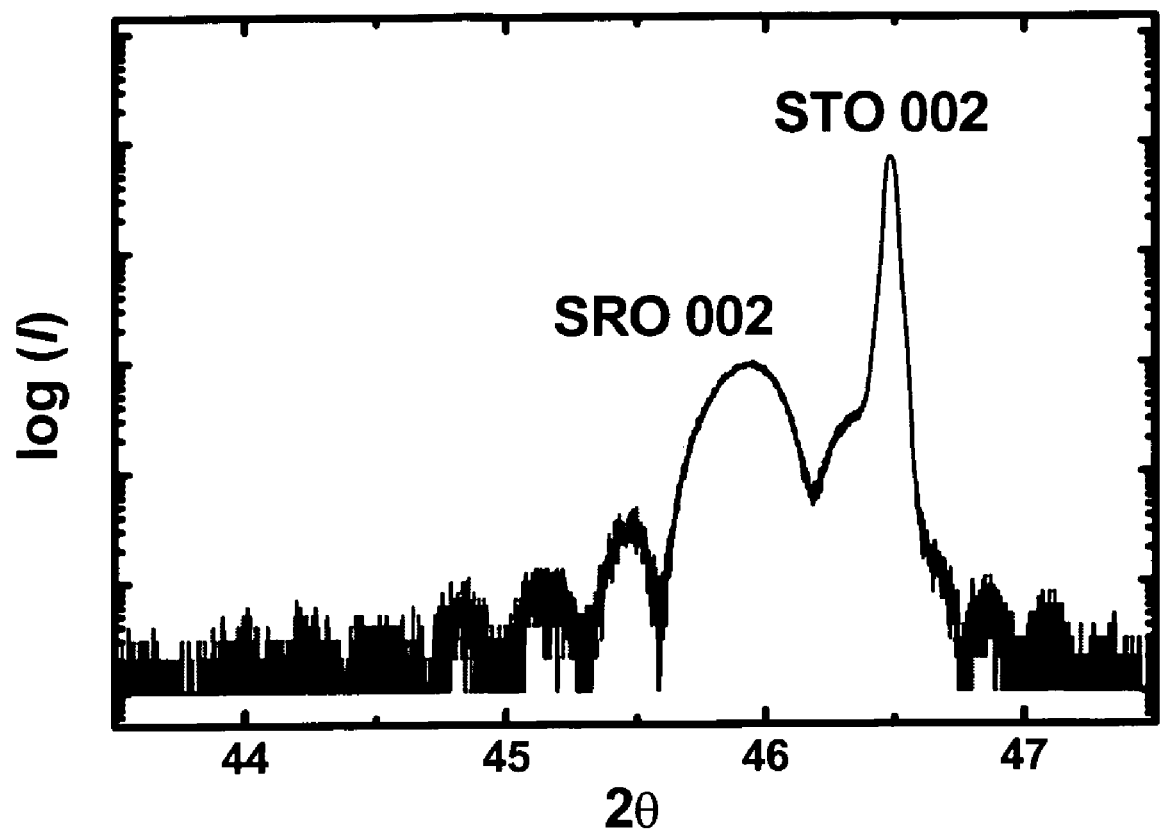
FIG. 5 is an X-ray diffraction spectrograph of a $SrRuO_3$ (SRO) first conductive layer deposited under preferred PLD conditions.

FIG. 3 shows the surface topography of a $SrRuO_3$ first conductive layer deposited under preferred PLD conditions. Smooth high quality layers were deposited at 700° C., 200 mJ, 2 Hz and $PO_2$ of 100 mTorr using a PLD method. As shown in FIG. 4, step-flow layers deposited under high oxygen partial pressure conditions generally exhibited preferably low initial resistivity. Post-deposition, these films were annealed in-situ at 500° C. at a $PO_2$ of 300 Torr for about 1 hour. FIG. 5 shows an X-ray diffraction spectrograph of a $SrRuO_3$ (SRO) strain relaxed film as disposed on an $SiTiO_3$ (STO) substrate.

Figure 6:
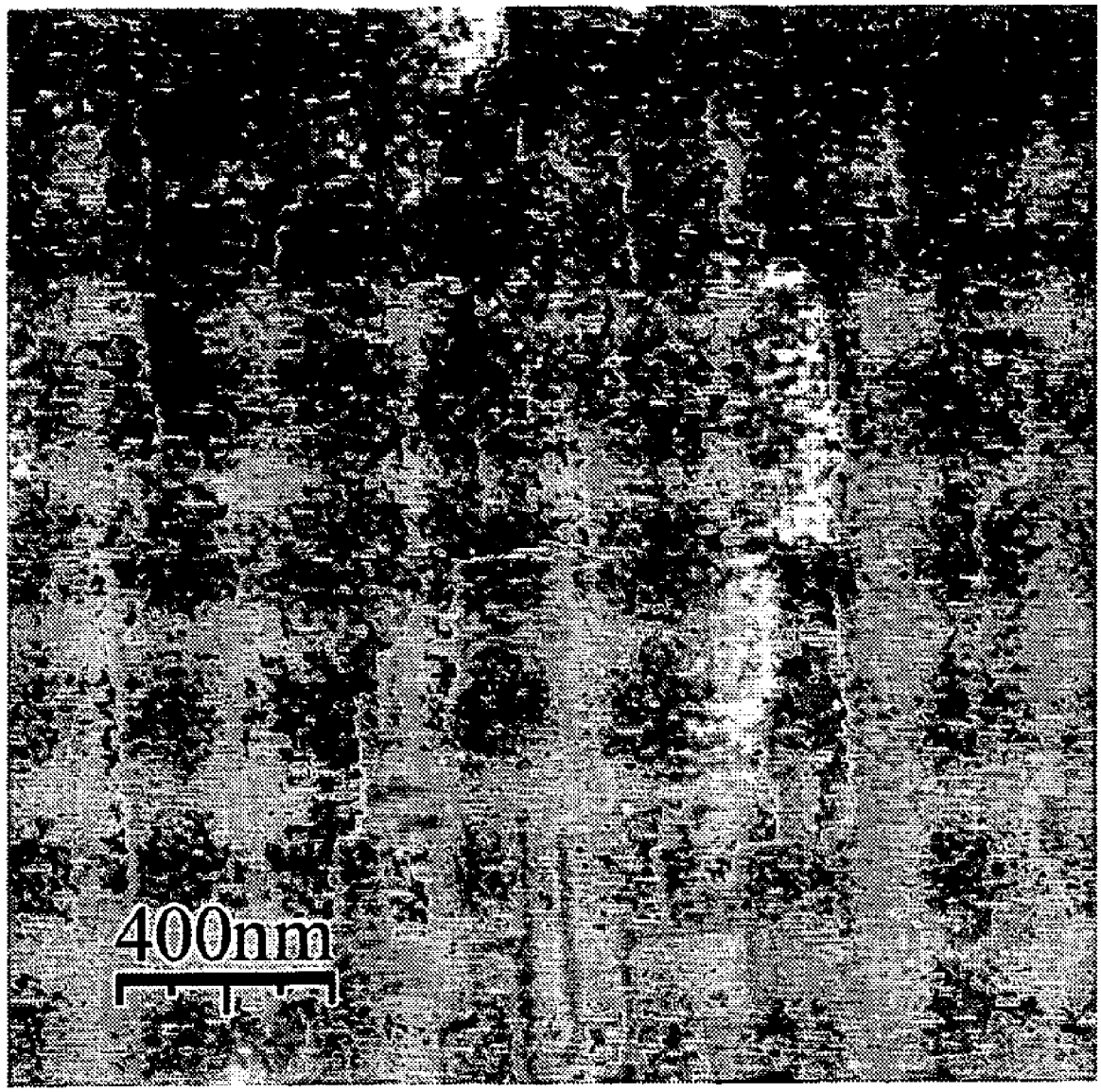
FIG. 6 shows the surface topography of a $LaAlO_3$:$SrRuO_3$ (LAO:SRO) layer using preferred PLD techniques at 500° C. and $PO_2$=1 mTorr.
Figure 7:
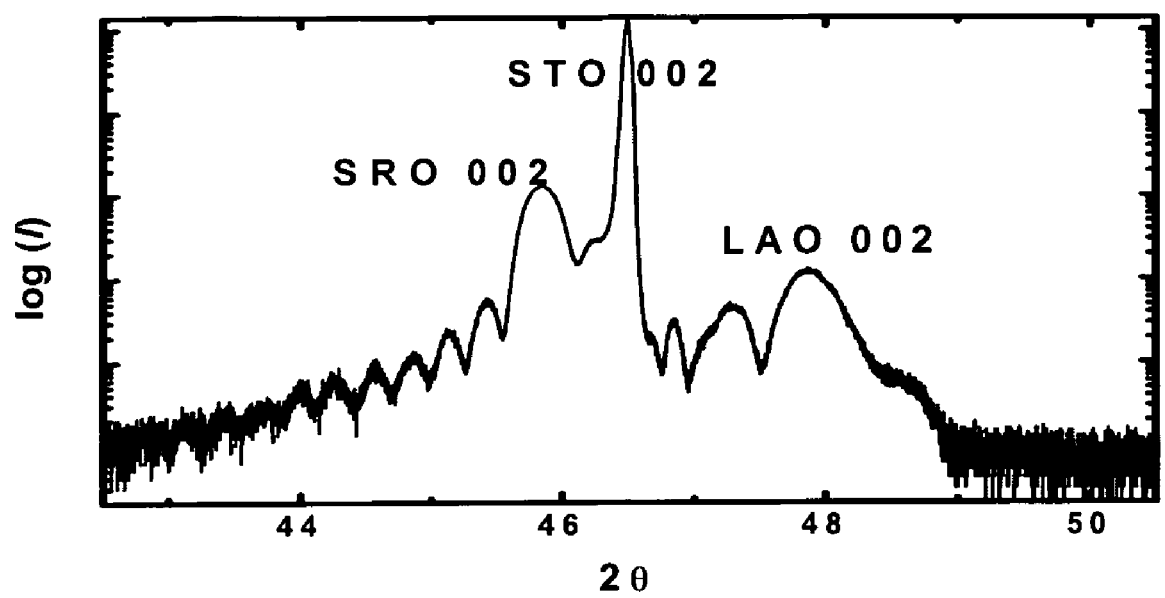
FIG. 7 shows an X-ray diffraction spectrograph of a preferable strain-relaxed $LaAlO_3$:$SrRuO_3$ (LAO:SRO) film as disposed on a $SrTiO_3$ (STO) substrate.
Figure 8:
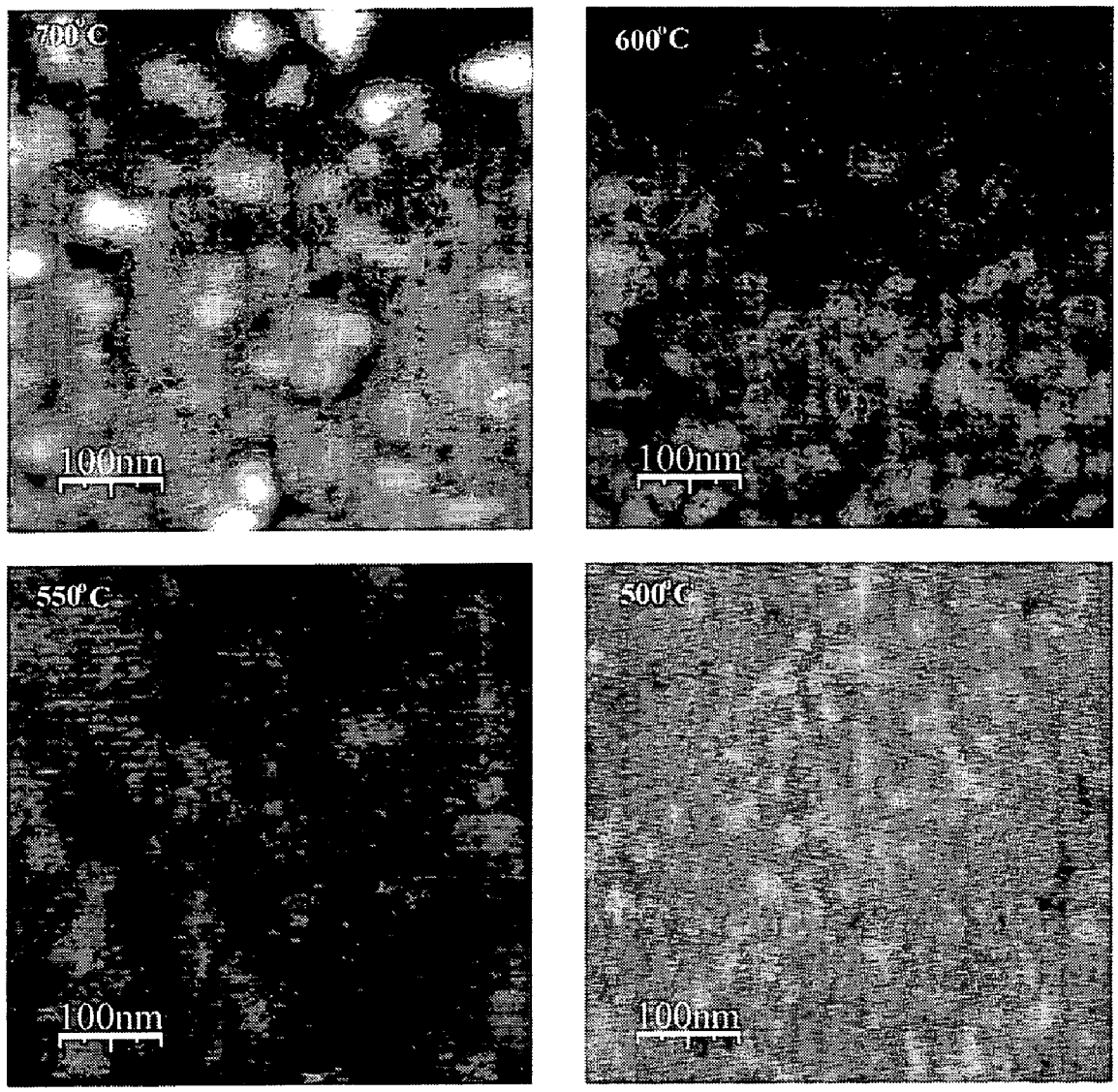
FIG. 8 depicts the surface topographies of $LaAlO_3$:$SrRuO_3$ (LAO:SRO) layers deposited at various temperatures.
Figure 9:
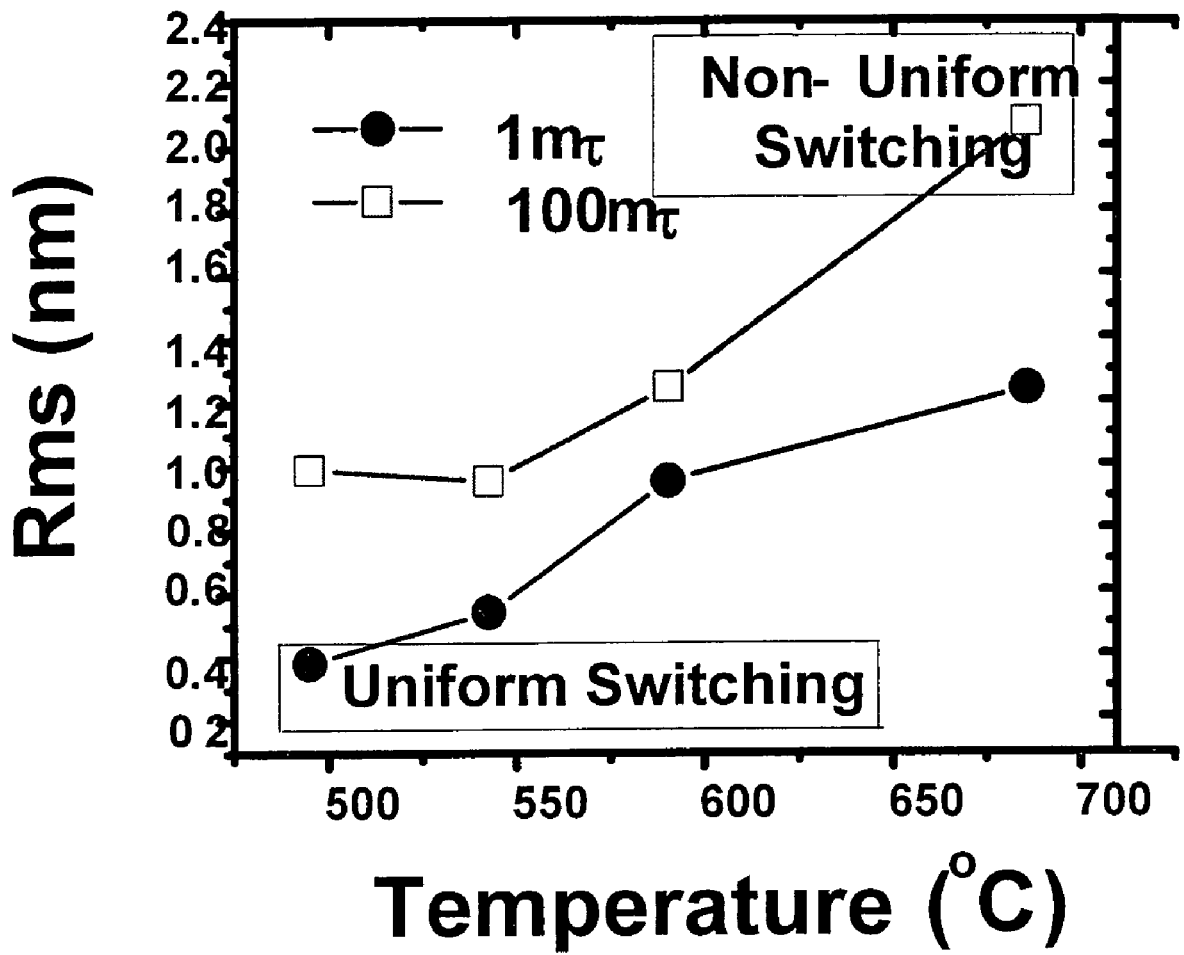
FIG. 9 shows the effect of PLD deposition conditions on resistance-switching of a $LaAlO_3$:$SrRuO_3$ (LAO:SRO) layer. Generally, higher PLD deposition temperatures resulted in greater surface roughness. Still further, greater oxygen partial pressure also resulted in greater surface roughness. Films with greater surface roughness showed generally non-uniform resistance-switching.

FIG. 6 shows the surface topography of a $LaAlO_3$:$SrRuO_3$ (LAO:SRO) layer deposited using preferred PLD techniques at 500° C. and $PO_2$ of about 1 mTorr. Per layer growth rates were about 0.0083 nm/laser-shot for LAO as compared to about 0.0084 nm/laser-shot for SRO. FIG. 7 shows an X-ray diffraction spectrograph of a preferable strain-relaxed LAO:SRO film as disposed on an STO substrate. FIG. 8 depicts the varied surface topographies of $LaAlO_3$:$SrRuO_3$ (LAO:SRO) layers deposited at the preferred partial pressure but assorted temperatures. Generally, at a $PO_2$ of about 1 mTorr, higher PLD deposition temperatures resulted in greater surface roughness. FIG. 9 shows the effect of PLD conditions on resistance-switching of $LaAlO_3$:$SrRuO_3$ (LAO:SRO) layers. Those films deposited at higher temperatures, higher partial oxygen pressure, or both, commonly resulted in greater surface roughness. Films with greater surface roughness generally showed poor resistance-switching performance.

Figure 10:
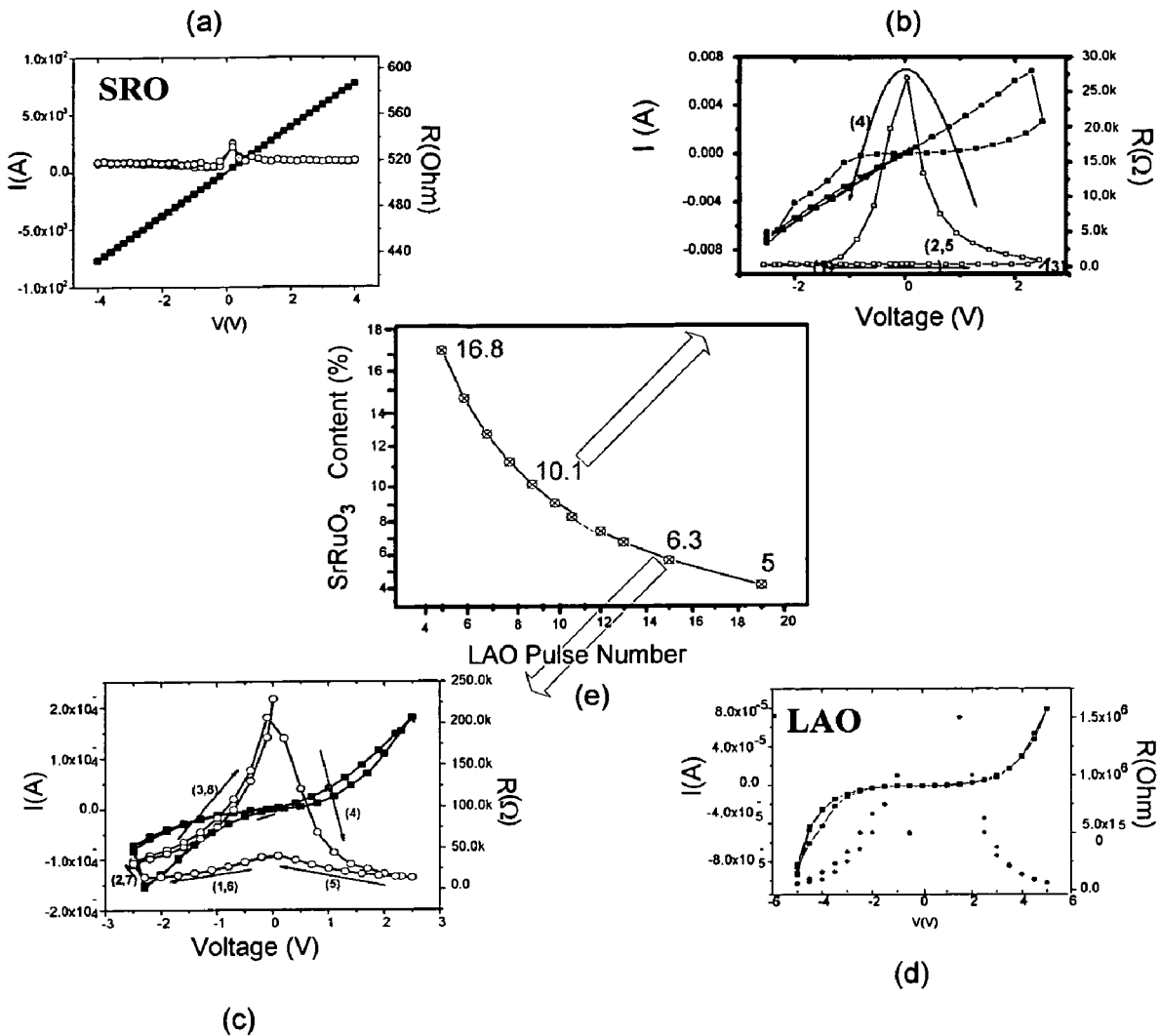
FIG. 10 depicts the resistance-switching performance of $LaAlO_3$:$SrRuO_3$ (LAO:SRO) films. Preferred resistance-switching performance may be obtained with about 6 to about 12 atomic percent $SrRuO_3$.
Figure 11:
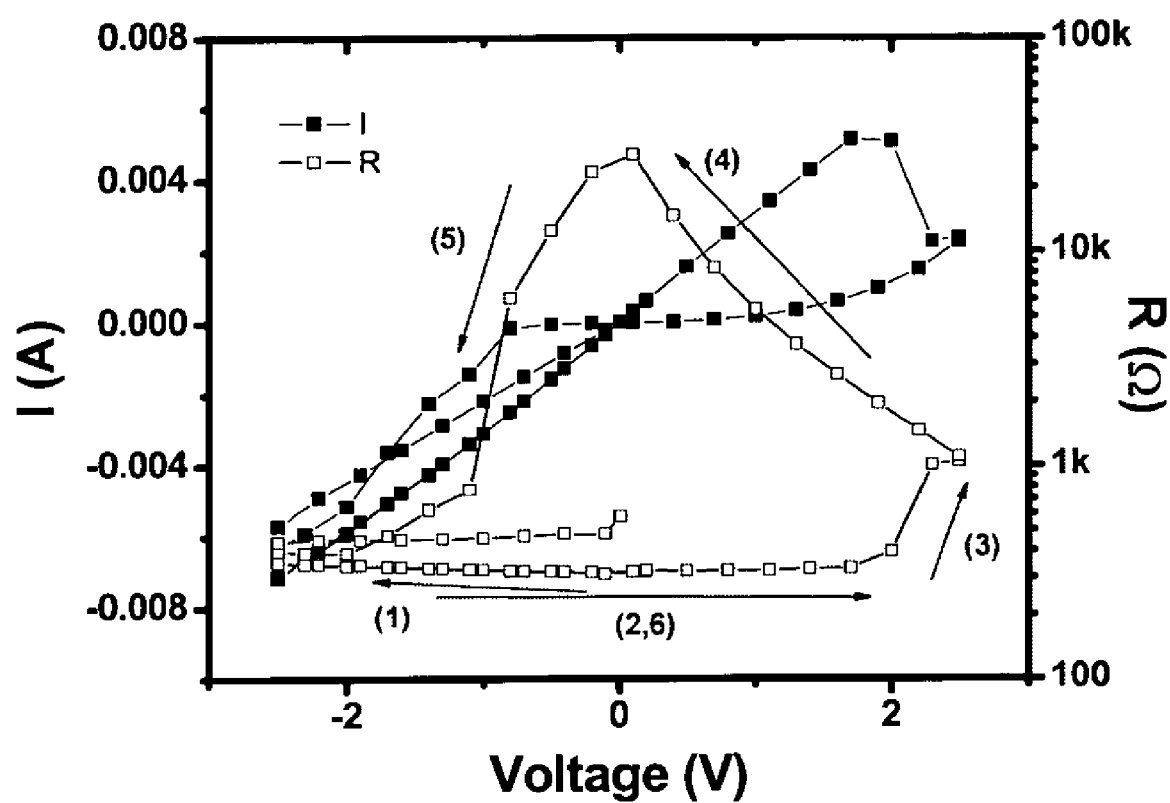
FIG. 11 shows the I-V/R-V plot for a preferred semiconductor device having a $LaAlO_3$:$SrRuO_3$ resistance-switching layer with about 10 atomic percent $SrRuO_3$.
Figure 12:
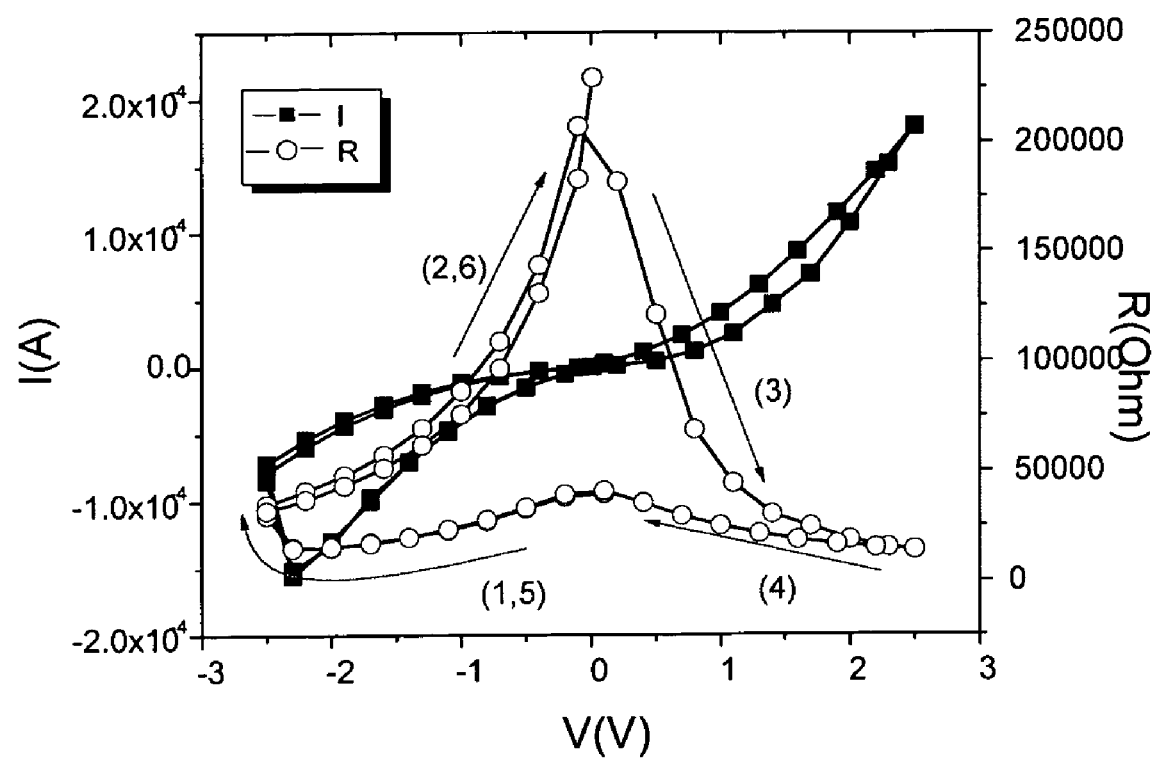
FIG. 12 shows the I-V/R-V plot for a preferred semiconductor device having a $LaAlO_3$:$SrRuO_3$ resistance-switching layer with about 6 atomic percent $SrRuO_3$.
Figure 13:
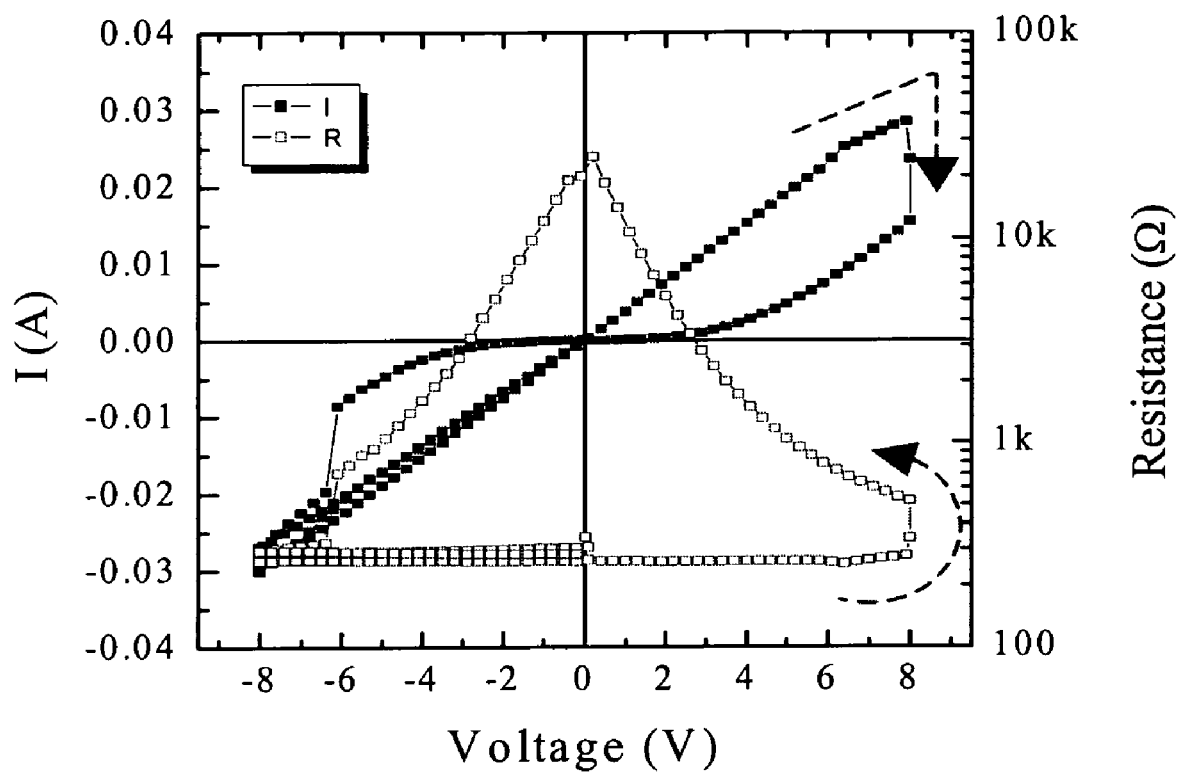
FIG. 13 shows the I-V/R-V plot for a preferred semiconductor device having a $CaZrO_3$:$SrRuO_3$ resistance-switching layer with about 10 atomic percent $SrRuO_3$.

FIG. 10 depicts the resistance-switching performance of $LaAlO_3$:$SrRuO_3$ (LAO:SRO) films. The LAO:SRO general electrical characteristic may be adjusted from insulating to conducting by changing the SRO content from about 2 to about 17 atomic percent. Preferred resistance-switching performance could be obtained with about 6 to about 12 atomic percent SRO. Indeed, FIGS. 10(b) and 10(c) show exemplary resistance-switching characteristics of the present invention at $SrRuO_3$ contents of about 10 atomic percent and about 6 atomic percent, respectively. FIGS. 10(a) and 10(d) comparatively show the general electrical characteristics of respective typical un-doped SRO and LAO films. FIG. 11 shows the I-V plot for a preferred semiconductor device having a $LaAlO_3$:$SrRuO_3$ resistance-switching layer with about 10 atomic percent $SrRuO_3$. At this $SrRuO_3$ content, the device shows a preferred hysteric resistance response to applied voltage. It should be noted that the baseline resistance, of about 300 Ω, for the $SrRuO_3$ first conductive layer (bottom electrode) is relatively high but does not adversely affect the overall resistance-switching performance of the device. FIG. 12 shows the I-V plot for a preferred semiconductor device having a $LaAlO_3$:$SrRuO_3$ resistance-switching layer with about 6 atomic percent $SrRuO_3$. Although the device exhibits a higher initial resistance, it also exhibits a hysteresis response to the applied voltage cycle. FIG. 13 shows a similar hysteresis effect for a preferred semiconductor device having a $CaZrO_3$:$SrRuO_3$ resistance-switching layer with about 10 atomic percent $SrRuO_3$.

As shown in FIGS. 10-13, the applied voltage cycle results in high initial current indicating a relatively low resistance. For a $LaAlO_3$:$SrRuO_3$ (LAO:SRO) resistance-switching layer, an abrupt change in slope then occurs at a large positive voltage indicating a switch to high resistance. For a $CaZrO_3$:$SrRuO_3$ (CZO:SRO) resistance-switching layer, this change also appears to occur at large positive voltage. This characteristic switching from low to high resistance indicates that the switching does not involve a filamentary mechanism in which an initially high resistance state transitions to a low resistance state after preferred conducting paths (filaments) are formed at a threshold voltage. Indeed, characteristic filament formation necessarily results in transition from high to low resistance rather than vice-versa.

In accordance with the present invention, the low or high resistance state persists as the magnitude of the voltage continues to increase in the same bias. The resistance state then switches when an appropriately large voltage is applied having an opposite bias. In this regard, a LAO:SRO oxide layer switches to a low resistance state, evidenced as high current on the I-V plot, as the reverse voltage reaches a large negative magnitude. Accordingly, a CZO:SRO oxide layer also switches to a low resistance state when the reverse voltage reaches a large negative magnitude. It is noted that the I-V and R-V response curves are similar among the various insulator matrix compositions and dopant concentrations, thus each showing some degree of current hysteresis and preferred resistance response. Still further, the hysteresis response is largely independent of starting voltage bias. Each insulator:dopant system will thus exhibit the same respective I-V and R-V response regardless of whether the initial voltage bias is positive or negative. Aspects of the current invention include compositional and deposition variations which result in devices having relatively low initial resistance wherein switching-to-high-resistance occurs at negative voltage of appropriate magnitude and switching-to-low-resistance occurs at a positive voltage of appropriate magnitude. And again, these devices would also have the same respective I-V and R-V responses whether the initial voltage is positive or negative.

Devices according to certain preferred aspects of the present invention may be particularly suited for random access memory (RAM) applications. For example, simple two-point resistance devices may be produced to read and write binary information. Thus, a first pulse would set the device to a first resistance state, i.e., a "0" state. The application of a second pulse, of opposite polarity would set the device to a second resistance state, i.e., a "1" state. In this manner, information can be "written" to the device upon the application of a voltage having the appropriate magnitude and polarity. The device may be "read" by applying a voltage pulse of lesser magnitude than the write pulse.

Figure 14:
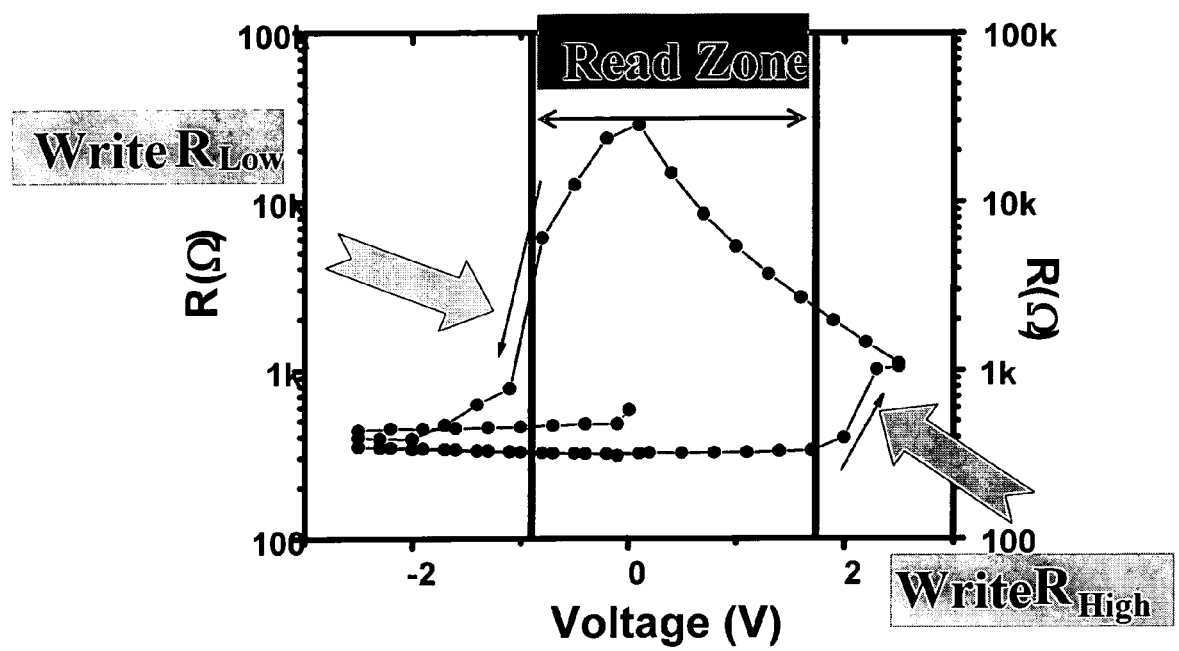
FIG. 14 shows that certain preferred semiconductor devices according to certain preferred aspects of the present invention have a lower initial resistance and switch to higher resistance at about 2 V, and switched back to low resistance at opposite bias at about −1 V. The semiconductor device comprised a $LaAlO_3$:$SrRuO_3$ resistance-switching layer with about 11 atomic percent $SrRuO_3$
Figure 15:
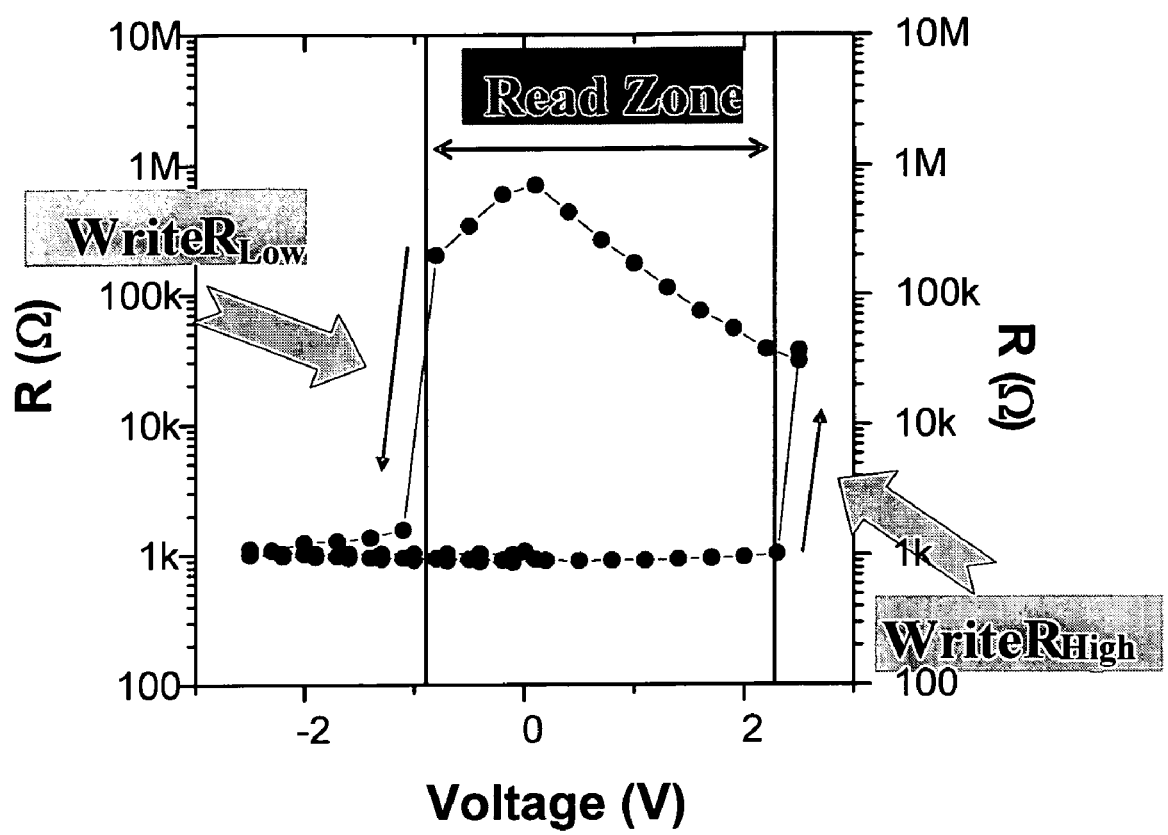
FIG. 15 shows that certain preferred semiconductor devices according to certain preferred aspects of the present invention have a lower initial resistance and switch to higher resistance at about 2 V, and switch back to low resistance at opposite bias at about −1 V. The semiconductor device comprised a $CaZrO_3$:$SrRuO_3$ resistance-switching layer with about 10 atomic percent $SrRuO_3$

FIG. 14 shows that semiconductor devices according to certain preferred aspects of the present invention having a low initial resistance and switch to higher resistance (write "1" state) at about 2 V, and switch back to low resistance (write "0" state) at an opposite bias of about −1 V. The device may be read at any intermediate voltage, for example 0.5 V. Thus, these devices have modest power consumption and would be particularly suited for micro-sized, or nano-sized, electronic devices. This device included a $LaAlO_3$:$SrRuO_3$ resistance-switching layer with about 11 atomic percent $SrRuO_3$ and a $SrRuO_3$ first conductive layer/bottom electrode. The resistance layer was deposited using a PLD method at about 700° C. and $PO_2$ of about 1 mTorr. Surface roughness was measured to be about 0.4 nm. Platinum was deposited as the second conductive layer/top electrode. FIG. 15 depicts the R-V for another device according to certain preferred aspects of the present invention. This device comprised a $CaZrO_3$:$SrRuO_3$ resistance-switching layer with about 10 atomic percent $SrRuO_3$. The resistance-switching layer was deposited on a $SrRuO_3$ first conductive layer/bottom electrode using a PLD method at 600° C. and $PO_2$ of $10^{-6}$ Torr. Surface roughness was measured to be about 0.5 nm. Platinum was deposited as the second conductive layer/top electrode. The device shows a low initial resistance while switching to a high resistance state (write "1" state) at about 2 V and switching back to a low resistance at about −1 V. This device may be read at any intermediate voltage, for example 0.5 V.

Figure 16:
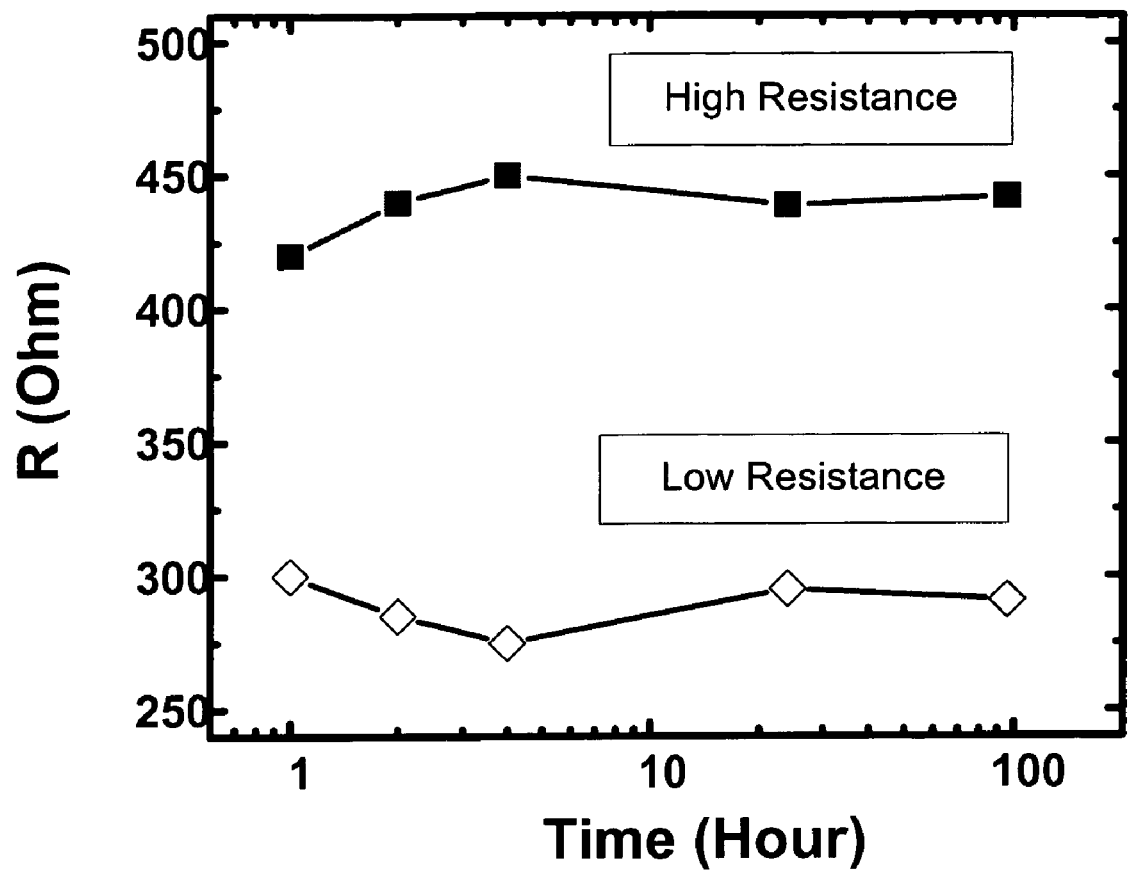
FIG. 16 shows the retention of low/high resistances obtained by preferred semiconductor device having a $LaAlO_3$:$SrRuO_3$ resistance-switching layer with about 10 atomic percent $SrRuO_3$.
Figure 17:
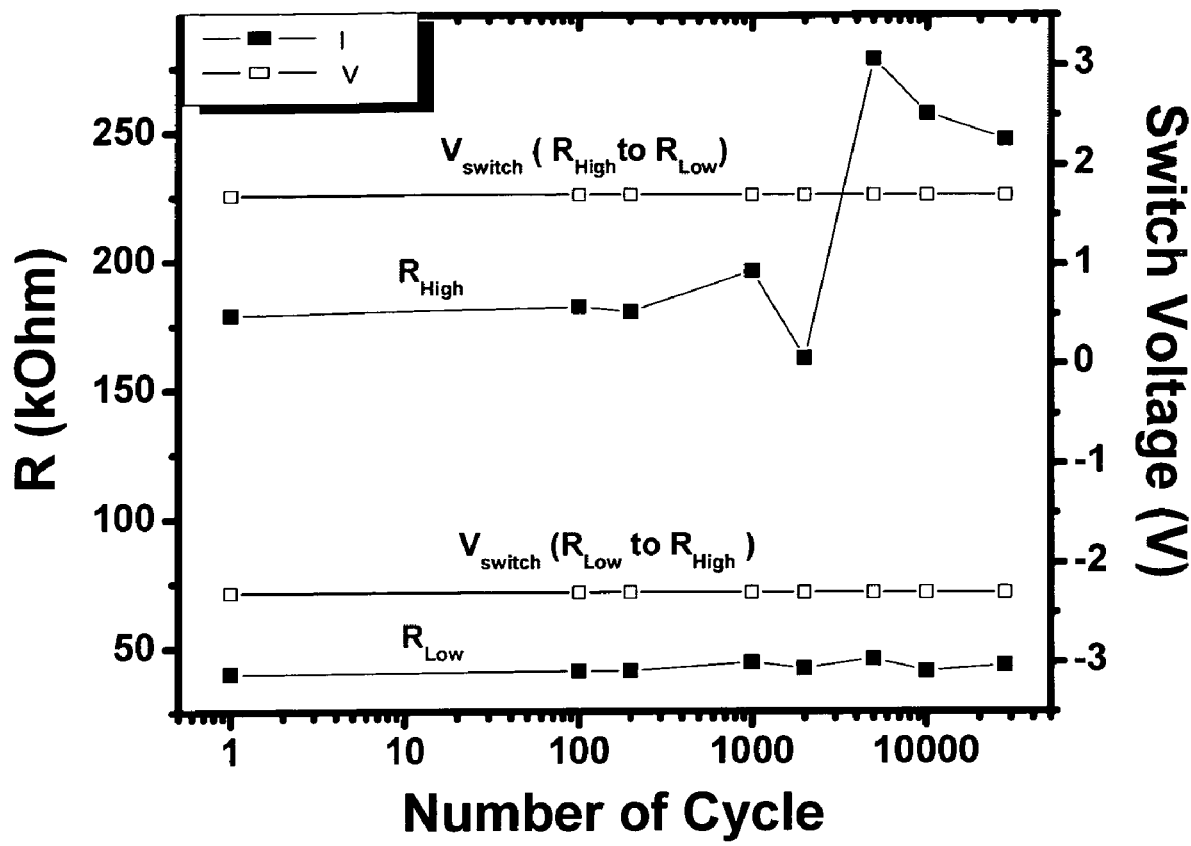
FIG. 17 illustrates the switching cycle performance of a semiconductor device having a $LaAlO_3$:$SrRuO_3$ resistance-switching layer with about 6 atomic percent $SrRuO_3$. The device showed little appreciable performance degradation over several thousand switching cycles.
Figure 18:
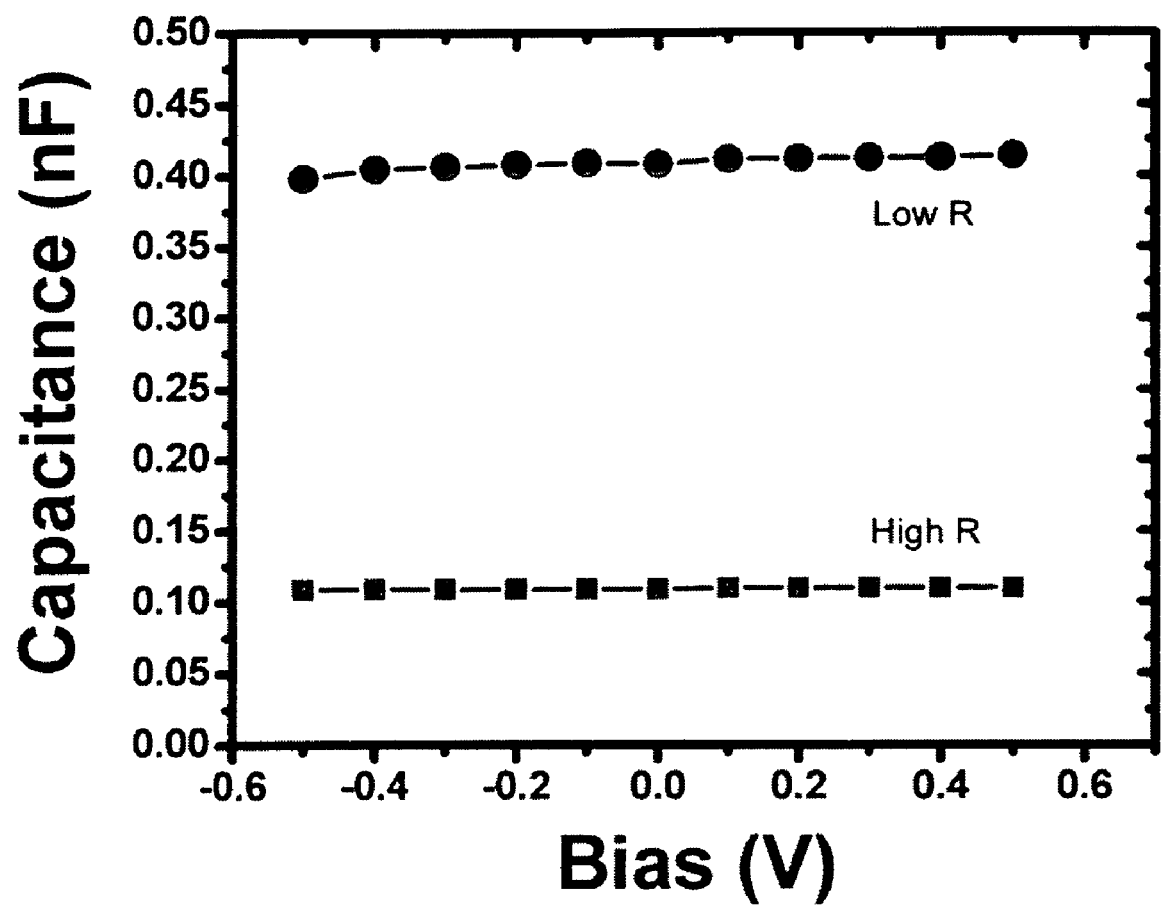
FIG. 18 shows the capacitance performance of a semiconductor device having a $LaAlO_3$:$SrRuO_3$ resistance-switching layer with about 6 atomic percent $SrRuO_3$.

FIG. 16 shows the retention of low/high resistances obtained by a preferred semiconductor device having a $LaAlO_3$:$SrRuO_3$ resistance-switching layer with about 10 atomic percent $SrRuO_3$. The resistance-switching layer was deposited on a $SrRuO_3$ first conductive layer/bottom electrode with Pt being the second conductive layer/top electrode. The resistance-switching layer was deposited at about 600° C. and $PO_2$ of about 100 mTorr using a PLD method. Surface roughness was measured to be about 0.37 nm, and the switching voltage was about 2V (−2V). Here, the device showed excellent retention of the low and high resistance states over the course of several days. FIG. 17 illustrates the switching cycle performance of a semiconductor device having a $LaAlO_3$:$SrRuO_3$ resistance-switching layer with about 6 atomic percent $SrRuO_3$. The resistance-switching layer was deposited at about 500° C. and $PO_2$ of about 1 mTorr. Sample surface roughness was measured to be about 0.34 nm, and the switching voltage was about 2 V (−2 V). Here, the device showed little appreciable switching performance degradation over several thousand switching cycles. FIG. 18 shows the capacitance variance at the high and low resistance states of a preferred device having a $LaAlO_3$:$SrRuO_3$ resistance-switching layer with about 11 atomic percent $SrRuO_3$. Here, the device was first set to either its high or low resistance state by the appropriate voltage pulse, and the capacitance was measured at 1 MHz. The capacitance at the high resistance state is approximate to that expected for a device having an un-doped $LaAlO_3$ active layer. At the low resistance state, however, the device exhibits about a fourfold increase in capacitance. Thus, the resistance states can be easily distinguished, and a device may be easily read, using a capacitance measurement method.

If one or more isolation layers are present, then an initial non-zero voltage is needed to transfer current across the isolation and resistance-switching layers, hence a higher resistance would be expected at the zero-voltage state. The inclusion of an isolation layer may thus alter the zero-voltage resistance value, but is not expected to change the overall "shape" of the R-V response curve. Such a device, may also have improved leakage characteristics (i.e., reduced leakage) and may have further improved retention of the read:write states.

Perovskite material systems have traditionally been used for capacitors, dielectrics, piezoelectrics, pyroelectric, and other related applications. In such applications, it is advantageous to have very low conductivity, i.e., very high resistivity, to minimize dielectric loss and/or leakage of stored charge. Perovskite compositions for such applications generally avoid conducting dopants. In those circumstances where dopants are used, a relatively small amount (typically less than about 2 atomic percent) is used to compensate for valence mismatch in the insulator matrix, for example a small amount of $Nb^{5+}$ can be used to compensate for the small amount of $Ti^{3+}$ in $BaTiO_3$. Perovskite material systems may also be used for conductors, electrodes, and other related applications. In these applications, however, very high conductivity, i.e., very low resistivity, is desired to minimize ohmic loss and power consumption. Therefore, the preferred compositions generally include a very high amount of conducting components (typically greater than about 70 atomic percent). Prior efforts in the art have thus taught either very highly-doped or minimally-doped perovskite materials systems for various technological applications. Here, the inventors have surprisingly found a significant and reproducible resistance-switching phenomenon upon mid-range doping of some perovskite material systems.

Figure 19:
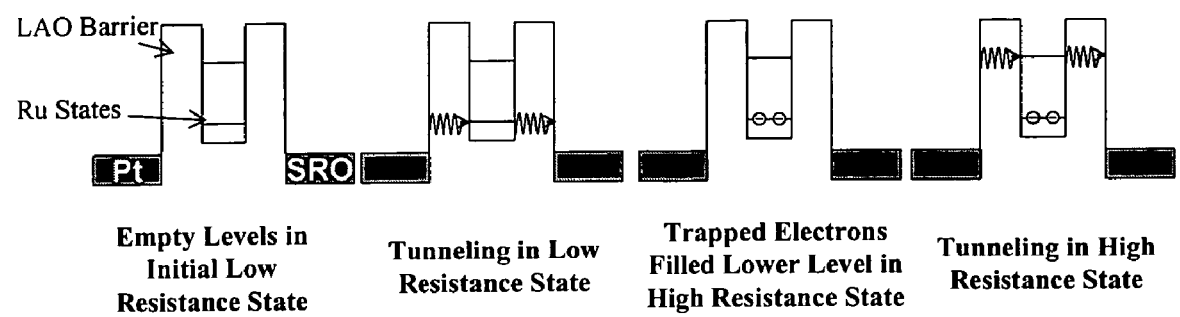
FIG. 19 depicts a schematic representation of electrical properties of a device according to certain preferred aspects of the present invention.

In regard to a presently preferred embodiment, and without being limited by theory, it is believed that Ru ions (conducting dopant) in the $LaAlO_3$:$SrRuO_3$ resistance-switching layer form isolated Ru conductive states separated by $LaAlO_3$ insulating barriers. Although these electron states are initially empty, under an external bias, electrons may tunnel across a series of $LaAlO_3$ (insulating matrix) barriers between these empty states to deliver a tunneling current at low resistance. FIG. 19 depicts the theorized manner in which current is believed to be transferred by the action of tunneling electrons. Initially, Ru ions having an energy, e.g., work function, similar to at least one of the first conductive layer and second conductive layer are available for tunneling electron transport. Thus, initial current is high and resistance is low due to the well-matched dopant:conductive layer electron energies. As current proceeds, and some tunneling electrons are trapped at the Ru sites, initially well-matched Ru electron states are filled and no longer available for electron transport. Resistance then increases, and current decreases, as electron transport must proceed via higher energy Ru states which are not as well-matched to the conductive layer(s). Thus, the device is switched to a high resistance state. When the voltage bias is reversed, the trapped electrons are released and the Ru states are again available for transport. Current thus increases and the device is switched back to a low resistance state.

The insulator oxide matrix of the resistance-switching layer should be a good insulator, having high breakdown field, and low conductivity in the desired temperature range of application. Still further, insulator oxide compositions in which cations may exist in more than one valence state, i.e., mixed valence compositions, should be avoided. These features prevent premature breakdown, and the formation of conducting paths due to "forming" or filamentary procedure wherein the application of a large voltage resulting in certain isolated preferred conducting paths in an initially highly electrically resistive material. See J. G. Simmons and RR Verdeber, *Proc. R. Soc. London, Ser. A* 301, 77 (1968). Here, preferred conducting oxide dopants typically contain cations that exist in more than one valence state. More generally, according to the present invention, dopant content is usually at a low enough concentration such that electron tunneling is the preferred conduction mechanism. At relatively high concentrations, however, "forming" or other conduction mechanisms may predominate. This tunneling threshold concentration may vary due to several factors including, but not limited to, layer thickness and spatial distribution of the conducting dopant. Thus, for example, the threshold concentration for thick films may be greater than that for relatively thin films.

In this manner, tunneling electrons in a insulator matrix: conducting dopant system may effect beneficial resistance-switching characteristics. Certain embodiments of the present invention are particularly advantageous in that high voltage "forming" or filamentary conduction is avoided and resistance-switching may occur at relatively low voltages, typically about 2 V (or about −2 V). Thus, these devices have modest power consumption and would be particularly suited for micro-sized, or nano-sized, semiconductor devices. Low/high resistance states of certain preferred oxide layers, and devices therewith, are remarkably stable while further exhibiting excellent retention and cycle fatigue characteristics.

Certain aspects of the present invention having been disclosed in connection with the foregoing variations and examples, additional variations will now be apparent to persons skilled in the art. The invention is not intended to be limited to the variations and examples specifically mentioned or presently preferred, and accordingly reference should be made to the appended claims to assess the spirit and scope of the invention in which exclusive rights are claimed.

What is claimed:

1. A semiconductor composition comprising:
at least about 75 atomic percent of an insulator oxide matrix having a perovskite structure; and
up to about 25 atomic percent of a conducting oxide dopant having a perovskite structure, wherein said dopant is in solid solution with said insulator oxide matrix.

2. The semiconductor composition of claim 1, wherein said dopant comprises at least one of $SrRuO_3$ and $CaRuO_3$.

3. The semiconductor composition of claim 1, wherein said semiconductor composition comprises about 5 to about 17 atomic percent SrRuO3 as a dopant.

4. The semiconductor composition of claim 1, wherein said semiconductor composition comprises about 6 to about 12 atomic percent SrRuO3 as a dopant.

5. The semiconductor composition of claim 1, wherein said dopant comprises at least one of SrMoO3, CaMoO3, and BaMoO3.

6. The semiconductor composition of claim 1, wherein said dopant comprises at least one of $SrIrO_3$, $CaIrO_3$, and $BaIrO_3$.

7. The semiconductor composition of claim 1, wherein said dopant comprises at least one of $SrVO_3$, $CaVO_3$, $SrCrO_3$, $SrFeO_3$, and $CaFeO_3$.

8. The semiconductor composition of claim 1, wherein said dopant comprises $CaX_1O_3$, wherein $X_1$ is Cr, Mn, Co, Nb, Rh, Ta, W, Re, or Os.

9. The semiconductor composition of claim 1, wherein said dopant comprises $SrX_1O_3$, wherein $X_1$ is Mn, Co, Nb, Rh, Ta, W, Re, or Os.

10. The semiconductor composition of claim 1, wherein said dopant comprises $BaX_1O_3$, wherein $X_1$ is V, Cr, Mn, Fe, Co, Nb, Ru, Rh, Ta, W, Re, or Os.

11. The semiconductor composition of claim 1, wherein said dopant comprises at least one of $LaTiO_3$, $LaNiO_3$, $LaCuO_3$, and $LaRhO_3$.

12. The semiconductor composition of claim 1, wherein said dopant comprises $A_1X_1O_3$, wherein $A_1$ is La, Ce, Pr, Nd, Pm, Sm, Eu, Gd, Tb, Dy, Ho, Er, Tm, Yb, Lu, or Y, and $X_1$ is Ti, V, Co, Ni, Cu, Nb, Mo, Ru, Rh, or Ir.

13. The semiconductor composition of claim 1, wherein said dopant comprises at least one of $(La,Sr)TiO_3$, $(La,Sr)MnO_3$, and $(La,Sr)FeO_3$.

14. The semiconductor composition of claim 1, wherein said dopant comprises $(A_1Ca)X_1O_3$, wherein $A_1$ is La, Ce, Pr, Nd, Pm, Sm, Eu, Gd, Tb, Dy, Ho, Er, Tm, Yb, Lu or Y, and $X_1$ is Ti, V, Cr, Mn, Fe, Co, Ni, Cu, Nb, Mo, Ru, Rh, Ta, W, Re, Os, or Ir.

15. The semiconductor composition of claim 1, wherein said dopant comprises $(A_1,Sr)X_1O_3$, wherein $A_1$ is La, Ce, Pr, Nd, Pm, Sm, Eu, Gd, Tb, Dy, Ho, Er, Tm, Yb, Lu or Y, and $X_1$ is V, Cr, Co, Ni, Cu, Nb, Mo, Ru, Rh, Ta, W, Re, Os, or Ir.

16. The semiconductor composition of claim 1, wherein said dopant comprises $(A_1,Ba)X_1O_3$, wherein $A_1$ is La, Ce, Pr, Nd, Pm, Sm, Eu, Gd, Tb, Dy, Ho, Er, Tm, Yb, Lu or Y, and $X_1$ is Ti, V, Cr, Mn, Fe, Co, Ni, Cu, Nb, Mo, Ru, Rh, Ta, W, Re, Os, or Ir.

17. The semiconductor composition of claim 1, wherein said semiconductor composition comprises about 5 to about 17 atomic percent of said dopant.

18. The semiconductor composition of claim 1, wherein said semiconductor composition comprises about 6 to about 12 atomic percent of said dopant.

19. The semiconductor composition of claim 1, wherein said insulator material comprises at least one of $CaZrO_3$, $SrZrO_3$, and $BaZrO_3$.

20. The semiconductor composition of claim 1, wherein said insulator oxide matrix comprises $X_1HfO_3$, wherein $X_1$ is selected from the group consisting of Ca, Sr, and Ba.

21. The semiconductor composition of claim 1, wherein said insulator oxide matrix comprises $X_1AlO_3$, wherein $X_1$ is selected from the group consisting of La, Y, Pr, Nd, Pm, Sm, Eu, Gd, Tb, Dy, Ho, and Er.

22. The semiconductor composition of claim 1, wherein said insulator oxide matrix comprises $X_1ScO_3$, wherein $X_1$ is selected from the group consisting of La, Y, Pr, Nd, Pm, Sm, Eu, Gd, Tb, Dy, Ho, and Er.

23. The semiconductor composition of claim 1, wherein said insulator oxide matrix comprises $Ba(X_1)_{1/3}(X_2)_{2/3}O_3$, wherein $X_1$ is selected from the group consisting of Mg and Zn, and $X_2$ is selected from the group consisting of Nb and Ta.

24. A semiconductor device comprising:
a first electrically conductive layer;
at least one semiconductor composition layer disposed on said first conductive layer, wherein said semiconductor composition layer comprises a solid solution of at least two perovskite materials,
wherein said semiconductor composition layer comprises:
at least 75 atomic percent of an insulator oxide matrix having a perovskite structure; and
up to about 25 atomic percent of a conducting oxide dopant having a perovskite structure, wherein said dopant is in solid solution with said insulator material; and
a second electrically conductive layer disposed on said semiconductor layer.

25. The semiconductor device of claim 24, wherein said device comprises at least one non-volatile memory device.

26. The semiconductor device of claim 24, wherein said device comprises at least one resistance random access memory device.

27. The semiconductor device of claim 24, further comprising a substrate wherein said first conductive layer is disposed on said substrate.

28. The semiconductor device of claim 27, wherein said substrate comprises $SrTiO_3$.

29. The semiconductor device of claim 27, wherein said substrate comprises at least one of platinum and silicon.

30. The semiconductor device of claim 27, wherein said first conductive layer and said semiconductor layer maintain an epitaxial relationship with said substrate layer.

31. The semiconductor device of claim 27, wherein said substrate layer has a crystal orientation of (100), or its crystallographic equivalent.

32. The semiconductor device of claim 24, wherein at least one of said first conductive layer and said second conductive layer comprises $SrRuO_3$.

33. The semiconductor device of claim 24, wherein at least one of said first conductive layer and said second conductive layer comprise Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, metal silicides, or combinations thereof.

34. The semiconductor device of claim 24, wherein at least one of said first conductive layer and second conductive layer comprise $CrO_2$, $MoO_2$, $RuO_2$, $RhO_2$, $WO_2$, $OsO_2$, $IrO_2$, $PtO_2$, or combinations thereof.

35. The semiconductor composition of claim 24, wherein said dopant comprises at least one of $SrRuO_3$ and $CaRuO_3$.

36. The semiconductor composition of claim 24, wherein said dopant comprises about 5 to about 17 weight percent $SrRuO_3$.

37. The semiconductor composition of claim 24, wherein said semiconductor composition layer comprises about 6 to about 12 atomic percent $SrRuO_3$ as a dopant.

38. The semiconductor composition of claim 24, wherein said semiconductor composition layer comprises about 5 to about 17 atomic percent of said dopant.

39. The semiconductor composition of claim 24, wherein said semiconductor composition layer comprises about 6 to about 12 atomic percent of said dopant.

40. The semiconductor composition of claim 24, wherein said dopant comprises at least one of $SrMoO_3$, $CaMoO_3$, and $BaMoO_3$.

41. The semiconductor composition of claim 24, wherein said dopant comprises at least one of $SrIrO_3$, $CaIrO_3$, and $BaIrO_3$.

42. The semiconductor composition of claim 24, wherein said dopant comprises at least one of $SrVO_3$, $CaVO_3$, $SrCrO_3$, $SrFeO_3$, and $CaFeO_3$.

43. The semiconductor composition of claim 24, wherein said dopant comprises $CaX_1O_3$, wherein $X_1$ is Cr, Mn, Co, Nb, Rh, Ta, W, Re, or Os.

44. The semiconductor composition of claim 24, wherein said dopant comprises $SrX_1O_3$, wherein $X_1$ is Mn, Co, Nb, Rh, Ta, W, Re, or Os.

45. The semiconductor composition of claim 24, wherein said dopant comprises $BaX_1O_3$, wherein $X_1$ is V, Cr, Mn, Fe, Co, Nb, Ru, Rh, Ta, W, Re, or Os.

46. The semiconductor composition of claim 24, wherein said dopant comprises at least one of $LaTiO_3$, $LaNiO_3$, $LaCuO_3$, and $LaRhO_3$.

47. The semiconductor composition of claim 24, wherein said dopant comprises $A_1X_1O_3$, wherein $A_1$ is La, Ce, Pr, Nd, Pm, Sm, Eu, Gd, Tb, Dy, Ho, Er, Tm, Yb, Lu, or Y, and $X_1$ is Ti, V, Co, Ni, Cu, Nb, Mo, Ru, Rh, or Ir.

48. The semiconductor composition of claim 24, wherein said dopant comprise at least one of $(La,Sr)TiO_3$, $(La,Sr)MnO_3$, and $(La,Sr)FeO_3$.

49. The semiconductor composition of claim 24, wherein said dopant comprises $(A_1,Ca)X_1O_3$, wherein $A_1$ is La, Ce, Pr, Nd, Pm, Sm, Eu, Gd, Tb, Dy, Ho, Er, Tm, Yb, Lu or Y, and $X_1$ is Ti, V, Cr, Mn, Fe, Co, Ni, Cu, Nb, Mo, Ru, Rh, Ta, W, Re, Os, or Ir.

50. The semiconductor composition of claim 24, wherein said dopant comprises $(A_1,Sr)X_1O_3$, wherein $A_1$ is La, Ce, Pr, Nd, Pm, Sm, Eu, Gd, Tb, Dy, Ho, Er, Tm, Yb, Lu or Y, and $X_1$ is V, Cr, Co, Ni, Cu, Nb, Mo, Ru, Rh, Ta, W, Re, Os, or Ir.

51. The semiconductor composition of claim 24, wherein said dopant comprises $(A_1,Ba)X_1O_3$, wherein $A_1$ is La, Ce, Pr, Nd, Pm, Sm, Eu, Gd, Tb, Dy, Ho, Er, Tm, Yb, Lu or Y, and $X_1$ is Ti, V, Cr, Mn, Fe, Co, Ni, Cu, Nb, Mo, Ru, Rh, Ta, W, Re, Os, or Ir.

52. The semiconductor composition of claim 24, wherein said insulator oxide matrix comprises at least one of $CaZrO_3$, $SrZrO_3$, and $BaZrO_3$.

53. The semiconductor composition of claim 24, wherein said insulator oxide matrix comprises $X_1HfO_3$, wherein $X_1$ is selected from the group consisting of Ca, Sr, and Ba.

54. The semiconductor composition of claim 24, wherein said insulator oxide matrix comprises $X_1AlO_3$, wherein $X_1$ is selected from the group consisting of La, Y, Pr, Nd, Pm, Sm, Eu, Gd, Tb, Dy, Ho, and Er.

55. The semiconductor composition of claim 24, wherein said insulator oxide matrix comprises $X_1ScO_3$, wherein $X_1$ is selected from the group consisting of La, Y, Pr, Nd, Pm, Sm, Eu, Gd, Tb, Dy, Ho, and Er.

56. The semiconductor composition of claim 24, wherein said insulator oxide matrix comprises at least one of $Ba(X_1)_{1/3}(X_2)_{2/3}O_3$ wherein $X_1$ is selected from the group consisting of Mg and Zn, and $X_2$ is selected from the group consisting of Nb and Ta.

57. The semiconductor device of claim 24, further comprising at least one isolation layer.

58. The semiconductor device of claim 57, wherein said isolation layer comprises at least one of $CaZrO_3$, $SrZrO_3$, and $BaZrO_3$.

59. The semiconductor device of claim 57, wherein said isolation layer comprises $X_1HfO_3$, wherein $X_1$ is selected from the group consisting of Ca, Sr, and Ba.

60. The semiconductor device of claim 57, wherein said isolation layer comprises $X_1AlO_3$, wherein $X_1$ is selected from the group consisting of La, Y, Pr, Nd, Pm, Sm, Eu, Gd, Tb, Dy, Ho, and Er.

61. The semiconductor device of claim 57, wherein said isolation layer comprises $X_1ScO_3$, wherein $X_1$ is selected from the group consisting of La, Y, Pr, Nd, Pm, Sm, Eu, Gd, Tb, Dy, Ho, and Er.

62. The semiconductor composition of claim 57, wherein said isolation layer comprises at least one of $Ba(X_1)_{1/3}(X_2)_{2/3}O_3$, wherein $X_1$ is selected from the group consisting of Mg and Zn, and $X_2$ is selected from the group consisting of Nb and Ta.

63. The semiconductor device of claim 24, further comprising at least one isolation layer wherein said isolation layer includes the same insulator oxide matrix as that used for the semiconductor composition layer.

64. The semiconductor device of claim 24, wherein said semiconductor composition layer has a surface roughness of less than about 2 nm 65. The semiconductor device of claim 24, wherein said semiconductor composition layer has a surface roughness of about 0.4 nm to about 1 nm 66. The semiconductor device of claim 24, wherein said semiconductor composition layer has a surface roughness of less than 0.4 nm 67. A semiconductor device comprising:
a first electrically conductive layer;
at least one semiconductor composition layer disposed on said first conductive layer, wherein said semiconductor layer comprises at least about 75 atomic percent of an insulator oxide matrix having a perovskite structure and up to about 25 atomic percent of a conducting oxide dopant having a perovskite structure; and
a second electrically conductive layer disposed on said semiconductor layer,
wherein said at least one dopant has a work function equivalent to at least one of said first conductive layer and second conductive layer.

68. The semiconductor device of claim 67, wherein said semiconductor layer comprises about 6 to about 12 atomic percent of said dopant.

69. The semiconductor device of claim 67, wherein said semiconductor layer comprises about 5 to about 17 atomic percent of said dopant.

70. The semiconductor device of claim 67, further comprising a substrate wherein said first conductive layer is disposed on said substrate.

71. The semiconductor device of claim 70, wherein said substrate comprises a semiconductor.

72. The semiconductor device of claim 70, wherein said substrate comprises $SrTiO_3$.

73. The semiconductor device of claim 70, wherein said first conductive layer and said semiconductor layer maintain an epitaxial relationship with said substrate layer.

74. The semiconductor device of claim 70, wherein said substrate layer has a crystal orientation of (100), or its crystallographic equivalent.

75. The semiconductor device of claim 70, wherein said substrate comprises at least one of platinum and silicon.

76. The semiconductor device of claim 67, wherein said first conductive layer comprises $SrRuO_3$.

77. The semiconductor device of claim 67, wherein at least one of said first conductive layer and said second conductive layer comprise Pt, Pd, Ni, Au, Ag, Cu, Ir, Rh, Co, Os, Ru, Fe, Re, Mn, W, Mo, Cr, Ta, Nb, V, Hf, Zr, Ti, Al, doped Si, metal silicides, or combinations thereof.

78. The semiconductor device of claim 67, wherein at least one of said first conductive layer and second conductive layer comprise $CrO_2$, $MoO_2$, $RuO_2$, $RhO_2$, $WO_2$, $OsO_2$, $IrO_2$, $PtO_2$, or combinations thereof.

79. The semiconductor device of claim 67, wherein said insulator oxide matrix comprises MgO.

80. The semiconductor composition of claim 67, wherein said insulator oxide matrix comprises at least one of $CaZrO_3$, $SrZrO_3$, and $BaZrO_3$.

81. The semiconductor composition of claim 67, wherein said insulator oxide matrix comprises $X_1HfO_3$, wherein $X_1$ is selected from the group consisting of Ca, Sr, and Ba.

82. The semiconductor device of claim 67, wherein said insulator oxide matrix comprises $X_1AlO_3$, wherein $X_1$ is selected from the group consisting of La, Y, Pr, Nd, Pm, Sm, Eu, Gd, Tb, Dy, Ho, and Er.

83. The semiconductor composition of claim 67, wherein said insulator oxide matrix comprises $X_1ScO_3$, wherein $X_1$ is selected from the group consisting of La, Y, Pr, Nd, Pm, Sm, Eu, Gd, Tb, Dy, Ho, and Er.

84. The semiconductor composition of claim 67, wherein said insulator oxide matrix comprises at least one of $Ba(X_1)_{1/3}(X_2)_{2/3}O_3$, wherein $X_1$ is selected from the group consisting of Mg and Zn, and $X_2$ is selected from the group consisting of Nb and Ta.

85. The semiconductor composition of claim 67, wherein said insulator oxide matrix comprises $X_1O_2$, wherein $X_1$ is Si, Ge, Zr, or Hf.

86. The semiconductor composition of claim 67, wherein said insulator oxide matrix comprises $X_2O_5$, wherein X is Nb or Ta.

87. The semiconductor composition of claim 67, wherein said insulator oxide matrix comprises $X_2O_3$, wherein X is Al, Ga, In, Sc, Y, Gd, Tb, Dy, Ho, Er, Tm, Yb, or Lu.

88. The semiconductor device of claim 67, wherein said dopant is at least one of Ti, V, Cr, Mn, Fe, Co, Ni, and Cu.

89. The semiconductor device of claim 67, wherein said dopant is at least one of TiO, VO, MnO, FeO, CoO, NiO, and CuO.

90. The semiconductor device of claim 67, wherein said dopant is at least one of $VO_2$, $CrO_2$, $NbO_2$, $MoO_2$, $RuO_2$, $RhO_2$, $WO_2$, $OsO_2$, $IrO_2$, and $PtO_2$.

91. The semiconductor device of claim 67, wherein said dopant is at least one of Pt, Pd, Au, Ag, Ir, Rh, Os, Ru, Re, W, Mo, Ta, Nb, Hf, Zr, and Al.

92. The semiconductor device of claim 67, wherein said dopant comprises at least one of $SrRuO_3$ and $CaRuO_3$.

93. The semiconductor device of claim 67, wherein said dopant comprises about 6 to about 12 weight percent $SrRuO_3$.

94. The semiconductor composition of claim 67, wherein said dopant comprises at least one of $SrMoO_3$, $CaMoO_3$, and $BaMoO_3$.

95. The semiconductor composition of claim 67, wherein said dopant comprises at least one of $SrIrO_3$, $CaIrO_3$, and $BaIrO_3$.

96. The semiconductor composition of claim 67, wherein said dopant comprises at least one of $SrVO_3$, $CaVO_3$, $SrCrO_3$, $SrFeO_3$, and $CaFeO_3$.

97. The semiconductor composition of claim 67, wherein said dopant comprises $CaX_1O_3$, wherein $X_1$ is Cr, Mn, Co, Nb, Rh, Ta, W, Re, or Os.

98. The semiconductor composition of claim 67, wherein said dopant comprises $SrX_1O_3$, wherein $X_1$ is Mn, Co, Nb, Rh, Ta, W, Re, or Os.

99. The semiconductor composition of claim 67, wherein said dopant comprises $BaX_1O_3$, wherein $X_1$ is V, Cr, Mn, Fe, Co, Nb, Ru, Rh, Ta, W, Re, or Os.

100. The semiconductor composition of claim 67, wherein said dopant comprises at least one of $LaTiO_3$, $LaNiO_3$, $LaCuO_3$, and $LaRhO_3$.

101. The semiconductor composition of claim 67, wherein said dopant comprises $A_1X_1O_3$, wherein $A_1$ is La, Ce, Pr, Nd, Pm, Sm, Eu, Gd, Tb, Dy, Ho, Er, Tm, Yb, Lu, or Y, and $X_1$ is Ti, V, Co, Ni, Cu, Nb, Mo, Ru, Rh, or Ir.

102. The semiconductor composition of claim 67, wherein said dopant comprises at least one of $(La,Sr)TiO_3$, $(La,Sr)MnO_3$, and $(La,Sr)FeO_3$.

103. The semiconductor composition of claim 67, wherein said dopant comprises $(A_1Ca)X_1O_3$, wherein $A_1$ is La, Ce, Pr, Nd, Pm, Sm, Eu, Gd, Tb, Dy, Ho, Er, Tm, Yb, Lu, or Y, and $X_1$ is Ti, V, Cr, Mn, Fe, Co, Ni, Co, Ni, Cu, Nb, Mo, Ru, Rh, Ta, W, Re, Os, or Ir.

104. The semiconductor composition of claim 67, wherein said dopant comprises $(A_1,Sr)X_1O_3$, wherein $A_1$ is La, Ce, Pr, Nd, Pm, Sm, Eu, Gd, Tb, Dy, Ho, Er, Tm, Yb, Lu, or Y, and $X_1$ is V, Cr, Co, Ni, Co, Ni, Cu, Nb, Mo, Ru, Rh, Ta, W, Re, Os, or Ir.

105. The semiconductor composition of claim 67, wherein said dopant comprises $(A_1,Ba)X_1O_3$, wherein $A_1$ is La, Ce, Pr, Nd, Pm, Sm, Eu, Gd, Tb, Dy, Ho, Er, Tm, Yb, Lu, or Y, and $X_1$ is Ti, V, Cr, Mn, Fe, Co, Ni, Co, Ni, Cu, Nb, Mo, Ru, Rh, Ta, W, Re, Os, or Ir.

106. The semiconductor device of claim 67, further comprising at least one isolation layer.

107. The semiconductor composition of claim 106, wherein said isolation layer comprises at least one of $CaZrO_3$, $SrZrO_3$, and $BaZrO_3$.

108. The semiconductor composition of claim 106, wherein said isolation layer comprises $X_1HfO_3$, wherein $X_1$ is selected from the group consisting of Ca, Sr, and Ba.

109. The semiconductor device of claim 106, wherein said isolation layer comprises $X_1AlO_3$, wherein $X_1$ is selected from the group consisting of La, Y, Pr, Nd, Pm, Sm, Eu, Gd, Tb, Dy, Ho, and Er.

110. The semiconductor composition of claim 106, wherein said isolation layer comprises $X_1ScO_3$, wherein $X_1$ is selected from the group consisting of La, Y, Pr, Nd, Pm, Sm, Eu, Gd, Tb, Dy, Ho, and Er.

111. The semiconductor composition of claim 106, wherein said isolation layer comprises at least one of $Ba(X_1)_{1/3}(X_2)_{2/3}O_3$, wherein $X_1$ is selected from the group consisting of Mg and Zn, and $X_2$ is selected from the group consisting of Nb and Ta.

112. The semiconductor device of claim 67, further comprising at least one isolation layer wherein said isolation layer includes the same insulator oxide matrix as that used for the semiconductor composition layer.

113. The semiconductor device of claim 67, wherein said device is a non-volatile memory device.

114. The semiconductor device of claim 67, wherein said device comprises at least one resistance random access memory device.

115. The semiconductor device of claim 67, wherein said semiconductor composition layer has a surface roughness of less than about 2 nm.

116. The semiconductor device of claim 67, wherein said semiconductor composition layer has a surface roughness of about 0.4 nm to about 1 nm.

117. The semiconductor device of claim 67, wherein said semiconductor composition layer has a surface roughness of less than 0.4 nm.

\* \* \* \* \*